(12) United States Patent
Ikeda et al.

(10) Patent No.: US 10,832,902 B2
(45) Date of Patent: Nov. 10, 2020

(54) SUBSTRATE PROCESSING APPARATUS AND SUBSTRATE PROCESSING METHOD

(71) Applicant: Tokyo Electron Limited, Tokyo (JP)

(72) Inventors: Yoshinori Ikeda, Kumamoto (JP); Yuki Taniguchi, Kumamoto (JP); Kazuyoshi Shinohara, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 565 days.

(21) Appl. No.: 15/375,295

(22) Filed: Dec. 12, 2016

(65) Prior Publication Data
US 2017/0186601 A1    Jun. 29, 2017

(30) Foreign Application Priority Data

Dec. 28, 2015 (JP) .................................. 2015-257147
Nov. 10, 2016 (JP) .................................. 2016-219389

(51) Int. Cl.
*H01L 21/02* (2006.01)
*H01L 21/67* (2006.01)
*B08B 3/04* (2006.01)

(52) U.S. Cl.
CPC .......... *H01L 21/02057* (2013.01); *B08B 3/04* (2013.01); *H01L 21/67051* (2013.01)

(58) Field of Classification Search
CPC ......... H01L 21/02057; H01L 21/67051; H01L 21/68728; B08B 3/04
See application file for complete search history.

(56) References Cited

U.S. PATENT DOCUMENTS

| 5,439,519 | A | * | 8/1995 | Sago | ...................... B05C 11/08 |
| | | | | | 118/501 |
| 2012/0192899 | A1 | * | 8/2012 | Higashijima | ..... H01L 21/67017 |
| | | | | | 134/22.1 |
| 2012/0260946 | A1 | * | 10/2012 | Ogata | ............... H01L 21/67034 |
| | | | | | 134/18 |
| 2014/0026927 | A1 | * | 1/2014 | Ogata | ............... H01L 21/67051 |
| | | | | | 134/104.2 |
| 2014/0137902 | A1 | * | 5/2014 | Aiura | ................ H01L 21/68735 |
| | | | | | 134/95.2 |
| 2014/0251539 | A1 | * | 9/2014 | Mizuno | ............. H01L 21/67051 |
| | | | | | 156/345.23 |
| 2017/0200624 | A1 | * | 7/2017 | Higashijima | ....... C11D 11/0047 |

FOREIGN PATENT DOCUMENTS

JP     2013-089628 A     5/2013

* cited by examiner

*Primary Examiner* — Alexander Markoff
(74) *Attorney, Agent, or Firm* — Abelman, Frayne & Schwab

(57) ABSTRACT

Disclosed is a substrate processing apparatus including: a holding unit that holds a substrate; a processing liquid supply unit that supplies a processing liquid to the substrate; a cup that includes a bottom portion, a tubular peripheral wall portion erected on the bottom portion, a liquid receiving portion provided above the peripheral wall portion and configured to receive the processing liquid scattered from the substrate, and a groove portion formed in a circumferential direction on an upper surface of the peripheral wall portion, and surrounds the holding unit; and a cleaning liquid supply unit that supplies a cleaning liquid to the upper surface of the peripheral wall portion.

14 Claims, 22 Drawing Sheets

SUBSTRATE PROCESSING APPARATUS AND SUBSTRATE PROCESSING METHOD

CROSS-REFERENCE TO RELATED APPLICATIONS

This application is based on and claims priority from Japanese Patent Application Nos. 2015-257147 and 2016-219389 filed on Dec. 28, 2015 and Nov. 10, 2016, respectively, with the Japan Patent Office, the disclosures of which are incorporated herein in their entirety by reference.

TECHNICAL FIELD

Exemplary embodiments disclosed herein relate to a substrate processing apparatus and a substrate processing method.

BACKGROUND

Conventionally, a substrate processing apparatus has been known, which performs various processings on a substrate (e.g., a semiconductor wafer or a glass substrate) by supplying a predetermined processing liquid (see, e.g., Japanese Patent Laid-Open Publication No. 2013-089628).

The above-mentioned substrate processing apparatus is configured to receive, for example, a processing liquid scattered from the substrate in a cup, which is provided to surround the periphery of the substrate, and discharge the processing liquid. The cup includes, for example, a peripheral wall portion that is erected on the bottom portion of the cup, and a liquid receiving portion that is provided on an upper surface of the peripheral wall portion to receive the processing liquid scattered from the substrate. The cup is configured such that the liquid receiving portion is movable up and down with respect to the peripheral wall portion.

SUMMARY

A substrate processing apparatus according to an aspect of an exemplary embodiment includes a holding unit, a processing supply unit, a cup, and a cleaning liquid supply unit. The holding unit holds a substrate. The processing liquid supply unit supplies a processing liquid to the substrate. The cup includes a bottom portion, a tubular peripheral wall portion erected on the bottom portion, a liquid receiving portion provided above the peripheral wall portion and configured to receive the processing liquid scattered from the substrate, and a groove portion formed in a circumferential direction on an upper surface of the peripheral wall portion. The cup surrounds the holding unit. The cleaning liquid supply unit supplies a cleaning liquid to the upper surface of the peripheral wall portion.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
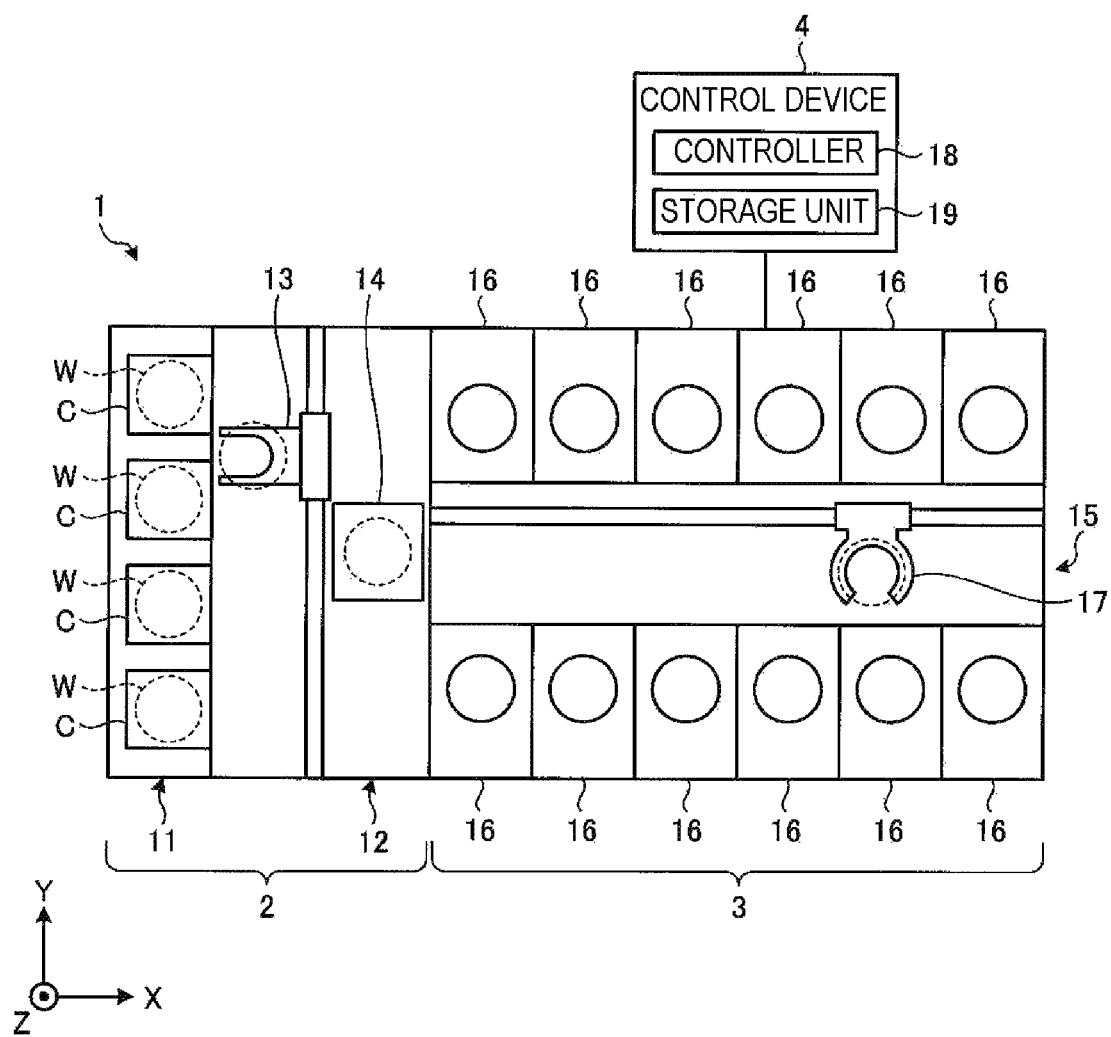
FIG. 1 is a view illustrating a schematic configuration of a substrate processing system according to a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the conventional technique, it has been found that a processing liquid atmosphere of the used processing liquid, or the scattered liquid is infiltrated into, for example, a gap between the liquid receiving portion and the peripheral wall portion, and the infiltrated processing liquid atmosphere is dried so that foreign matters (e.g., crystals of the processing liquid) is attached to the upper surface of the peripheral wall portion of the cup.

In an aspect of an exemplary embodiment, an object of the present disclosure is to provide a substrate processing apparatus and a substrate processing method capable of removing the foreign matters attached to the upper surface of the peripheral wall portion of the cup.

A substrate processing apparatus according to an aspect of an exemplary embodiment includes a holding unit, a processing supply unit, a cup, and a cleaning liquid supply unit. The holding unit holds a substrate. The processing liquid supply unit supplies a processing liquid to the substrate. The cup includes a bottom portion, a tubular peripheral wall portion erected on the bottom portion, a liquid receiving portion provided above the peripheral wall portion and configured to receive the processing liquid scattered from the substrate, and a groove portion formed in a circumferential direction on an upper surface of the peripheral wall portion. The cup surrounds the holding unit. The cleaning liquid supply unit supplies a cleaning liquid to the upper surface of the peripheral wall portion.

The cup includes a support member configured to support the liquid receiving portion, and move up and down the liquid receiving portion with respect to the peripheral wall portion, and an insertion hole formed inside the peripheral wall portion to allow the support member to be inserted therethrough, and including an opening on the upper surface of the peripheral wall portion, in which the opening is formed to overlap with at least a part of the groove portion in a plan view.

The cleaning liquid supply unit includes a cleaning liquid ejection port formed in the groove portion.

The cleaning liquid supply unit includes a cleaning liquid supply path connected to the cleaning liquid ejection port, and the cleaning liquid supply path is inclined in the circumferential direction of the peripheral wall portion.

The cleaning liquid supply unit includes a cleaning liquid supply pipe connected to a cleaning liquid source, and a hydropower of the cleaning liquid from the cleaning liquid supply pipe is weakened between the cleaning liquid supply pipe and the cleaning liquid ejection port.

The cleaning liquid ejection port has an opening area larger than an area of a flow path of the cleaning liquid supply pipe.

The cleaning liquid supply unit includes an intermediate portion provided between the cleaning liquid supply pipe and the cleaning liquid ejection port, the intermediate portion includes a base formed in a columnar shape, a recess formed in the circumferential direction on a lateral surface of the base, an inlet formed in the base and connected to the cleaning liquid supply pipe, and an outlet formed in the recess to allow the cleaning liquid flowing into the inlet to flow out, and the hydropower of the cleaning liquid from the cleaning liquid supply pipe is weakened by the intermediate portion.

The peripheral wall portion includes an inclined portion formed on the upper surface and having a downward slope toward the groove portion.

The peripheral wall portion includes an inclined portion formed on the upper surface and having a downward slope toward the lateral surface.

The substrate processing apparatus further includes a controller configured to control the cleaning liquid supply unit and the liquid receiving portion, in which the controller supplies the cleaning liquid from the cleaning liquid supply unit in a state where the liquid receiving portion is moved to a retreat position below a processing position.

The cleaning liquid supply unit changes a flow rate of the cleaning liquid when cleaning the upper surface of the peripheral wall portion and when cleaning a lower surface of the liquid receiving portion.

The substrate processing apparatus further includes a controller configured to control the cleaning liquid supply unit and the holding unit, in which the controller supplies the cleaning liquid in a state where the holding unit is rotated.

The cleaning liquid supply unit includes a plurality of outlets for the cleaning liquid which are different in opening direction, and the controller supplies the cleaning liquid from the plurality of outlets of the cleaning liquid supply unit in a state where the holding unit is rotated in a predetermined direction, and then supplies the cleaning liquid from the plurality of outlets of the cleaning liquid supply unit in a state where the holding unit is rotated in a direction opposite to the predetermined direction.

The cleaning liquid supply unit includes a cleaning liquid ejection port formed in the groove portion and a cleaning liquid supply path connected to the cleaning liquid ejection port, the cleaning liquid supply path is inclined in the circumferential direction of the peripheral wall portion, the cleaning liquid supply unit further includes a cleaning liquid supply pipe connected to a cleaning liquid supply source, the cleaning liquid ejection port has an opening area larger than a flow path of the cleaning liquid supply pipe, and a cleaning liquid retaining portion is provided between the cleaning liquid supply pipe and the cleaning liquid ejection port.

A substrate processing method according to an aspect of an exemplary embodiment includes holding a substrate; supplying a processing liquid to the substrate; and supplying a cleaning liquid to an upper surface of a tubular peripheral wall portion of a cup, the cup further including a bottom portion on which the peripheral wall portion is erected, a liquid receiving portion provided above the peripheral wall portion to receive the processing liquid scattered from the substrate, and a groove portion formed in a circumferential direction on an upper surface of the peripheral wall portion, the liquid receiving portion being configured to surround the holding unit.

In the supplying the cleaning liquid, the cleaning liquid is supplied in a state where the liquid receiving portion is moved to a retreat position below a processing position, and then the cleaning liquid is supplied in a state where the liquid receiving portion is moved to the processing position and the holding unit is rotated in a predetermined direction.

In the supplying the cleaning liquid, the cleaning liquid is supplied in a state where the holding unit is rotated in a direction opposite to the predetermined direction while the liquid receiving portion is positioned at the processing position, and then the cleaning liquid is supplied in a state where the liquid receiving portion is moved to the retreat position while the holding unit is rotated in the opposite direction.

According to an aspect of the exemplary embodiment, it is possible to remove foreign matters attached to the upper surface of the peripheral wall portion of the cup.

Hereinafter, exemplary embodiments of a substrate processing apparatus and a substrate processing method disclosed herein will be described in detail with reference to the accompanying drawings. Further, the present disclosure is not limited to the following exemplary embodiments.

<1. Configuration of Substrate Processing System>

First Exemplary Embodiment

FIG. 1 is a view illustrating a schematic configuration of a substrate processing system according to an exemplary embodiment of the present disclosure. In the following, in order to clarify positional relationships, the X-axis, the Y-axis, and the Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C are placed to accommodate a plurality of substrates, i.e., semiconductor wafers (hereinafter, "wafers W") in the present exemplary embodiment, horizontally.

The transfer section 12 is provided adjacent to the carrier placing section 11, and provided with a substrate transfer device 13 and a delivery unit 14 therein. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 are arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a controller 18 and a storage unit 19. The storage unit 19 stores a program that controls various processings performed in the liquid processing system 1. The controller 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then, places the taken wafer W on the transfer unit 14. The wafer W placed on the transfer unit 14 is taken out from the transfer unit 14 by the substrate transfer device 17 of the processing station 3, and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
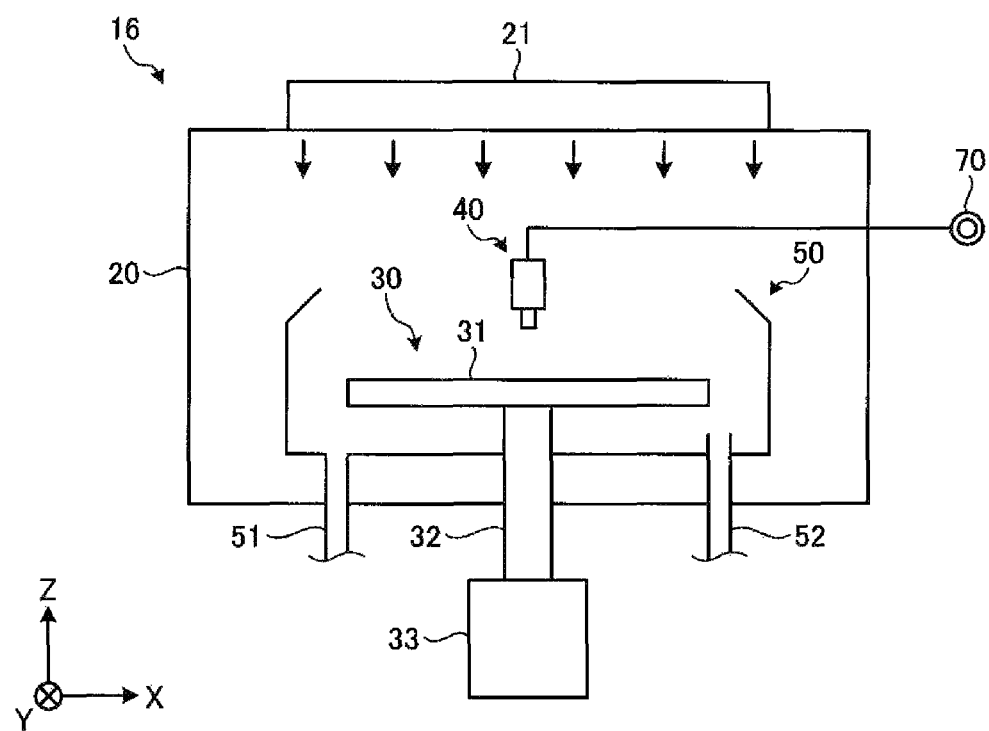
FIG. 2 is a view illustrating a schematic configuration of a processing unit.

Next, a schematic configuration of the processing unit 16 of the substrate processing system 1 will be described with reference to FIG. 2. FIG. 2 is a view illustrating a schematic configuration of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow within the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

<2. Specific Configuration of Processing Unit>

Figure 3:
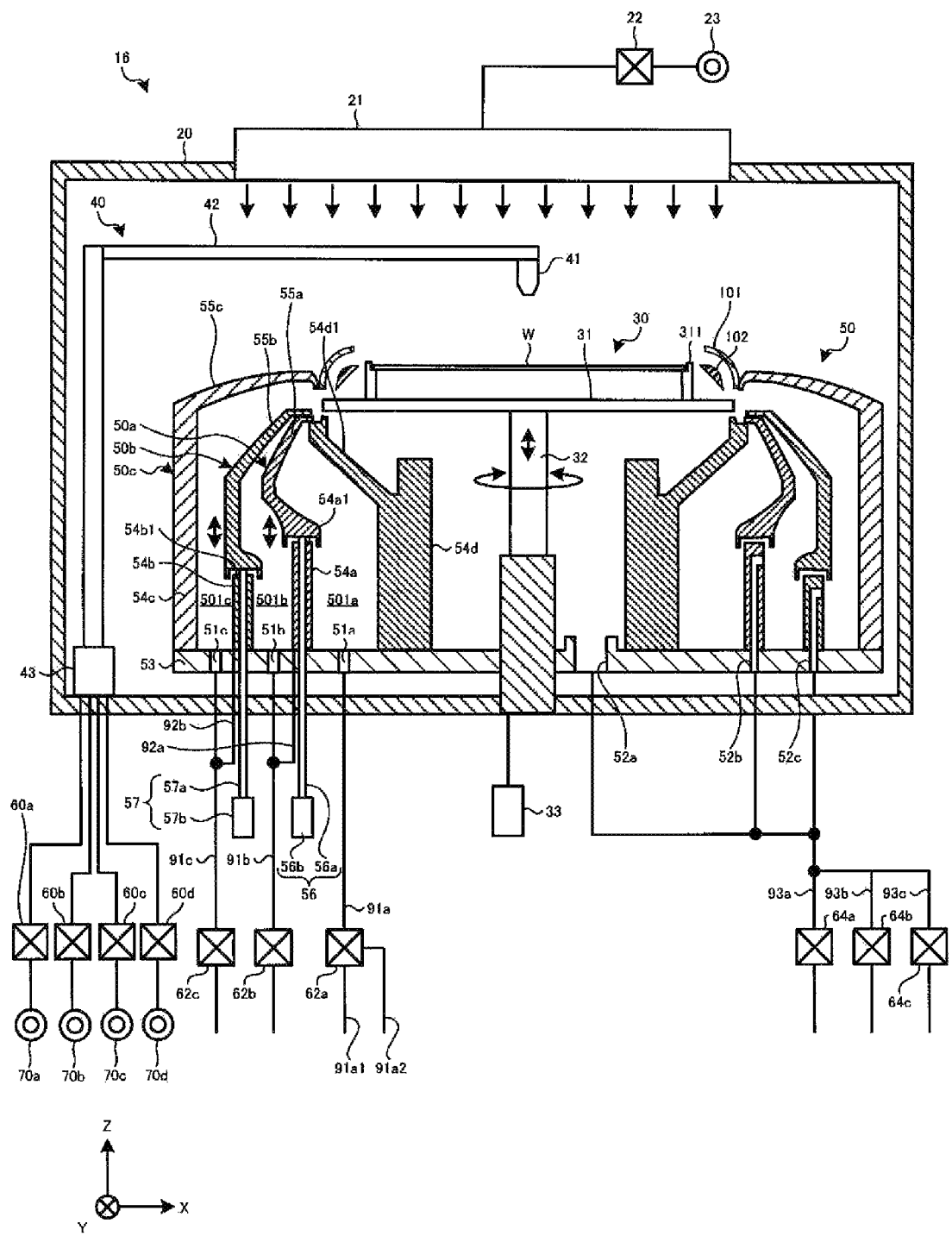
FIG. 3 is a schematic cross-sectional view illustrating a specific configuration of the processing unit.

Next, a specific configuration of the processing unit 16 will be described with reference to FIG. 3. FIG. 3 is a schematic cross-sectional view illustrating a specific configuration example of the processing unit 16.

As illustrated in FIG. 3, the FFU 21 is connected with an inert gas source 23 via a valve 22. The FFU 21 ejects an inert gas (e.g., $N_2$ gas), which is supplied from the inert gas source 23, into the chamber 20 as a downflow gas. Thus, when the inert gas is used as a downflow gas, the wafer W may be suppressed from being oxidized.

A holding member 311 is provided on the holding unit 31 of the substrate holding mechanism 30 to hold the wafer W from the lateral side. The wafer W is held horizontally in a state of being slightly spaced apart from the upper surface of the holding unit 31 by the holding member 311.

The processing fluid supply unit 40 includes a nozzle 41, an arm 42 that horizontally supports the nozzle 41, and a pivoting and lifting mechanism 43 that pivots and lifts the arm 42. One end of a pipe (not illustrated) is connected to the nozzle 41, and the other end of the pipe is branched into a plurality of pipes. Then, the ends of the branched pipes are connected with an alkaline processing liquid source 70a, an acidic processing liquid source 70b, an organic processing liquid source 70c, and a DIW source 70d, respectively. Further, one of valves 60a to 60d is provided between each of the sources 70a to 70d and the nozzle 41.

The processing fluid supply unit 40 supplies an alkaline processing liquid, an acidic processing liquid, an organic processing liquid, and a DIW (pure water at room temperature) supplied from the sources 70a to 70d, respectively, onto the front surface of the wafer W from the nozzle 41 to perform a liquid processing on the wafer W.

In the above description, the liquid processing is performed on the front surface of the wafer W, but is not limited thereto. For example, the liquid processing may be performed on the rear surface or the peripheral portion of the wafer W. In addition, in the present exemplary embodiment, the alkaline processing liquid, the acidic processing liquid, the organic processing liquid, and DIW are supplied from a single nozzle 41, but the processing fluid supply unit 40 may be provided with a plurality of nozzles corresponding to the processing liquids, respectively.

A first rotary cup 101 and a second rotary cup 102 are provided in the peripheral portion of the holding unit 31 to rotate integrally with the holding unit 31. As illustrated in FIG. 3, the second rotary cup 102 is disposed inside the first rotary cup 101.

The first rotary cup 101 and the second rotary cup 102 are generally formed in a ring shape. As the first and second rotary cups 101, 102 are rotated along with the holding unit 31, the first and second rotary cups 101, 102 guide the processing liquid scattered from the rotating wafer W into the recovery cup 50.

The recovery cup 50 includes a first cup 50a, a second cup 50b, and a third cup 50c in this order from the inner side close to the rotation center of the rotating wafer W held by the holding unit 31. Further, the recovery cup 50 includes a cylindrical inner wall portion 54d around the rotation center of the wafer W, on the inner peripheral side of the first cup 50a.

The first to third cups 50a to 50c and the inner wall portion 54d are provided on a bottom portion 53 of the recovery cup 50. Specifically, the first cup 50a includes a first peripheral wall portion 54a and a first liquid receiving portion 55a.

The first peripheral wall portion 54a are erected on the bottom portion 53, and is formed in a tubular (e.g., cylindrical) shape. A space is defined between the first peripheral wall portion 54a and the inner wall portion 54d, and the space serves as a first drain groove 501a to recover and discharge, for example, the processing liquid. The first liquid receiving portion 55a is provided above an upper surface 54a1 of the first peripheral wall portion 54a.

Further, the first cup 50a includes a first lifting mechanism 56. Thus, the first cup 50a is movable up and down by the lifting mechanism 56. Particularly, the first lifting mechanism 56 includes a first support member 56a and a first lift driving unit 56b.

The first support member 56a is an elongated member. There is provided a plurality of (e.g., three (3)) first support members 56a, only one of which is illustrated in FIG. 3. The first support member 56a is movably inserted through an insertion hole formed inside the first peripheral wall portion 54. The first support member 56a may be, for example, a cylindrical rod, but is not limited thereto.

The first support member 56a is positioned such that the upper end thereof is exposed from the upper surface 54a1 of the first peripheral wall portion 54a, and connected to the lower surface of the first receiving portion 55a to support the first liquid receiving portion 55a from the lower side thereof. Meanwhile, the first lift driving unit 56b is connected to the lower end of the first support member 56a.

The first lift driving unit 56b lifts the first support member 56a, for example, in the Z-axis direction. Accordingly, the first support member 56a lifts the first liquid receiving portion 55a with respect to the first peripheral wall portion 54a. An air cylinder may be used as the first lift driving unit 56b. Further, the first lift driving unit 56b is controlled by the control device 4.

The first liquid receiving portion 55a driven by the first lift driving unit 56b is moved between a processing position where the processing liquid scattered from the rotating wafer W is received and a retreat position retreated from the processing position to the lower side.

Specifically, when the first liquid receiving portion 55a is positioned at the processing position, an opening is formed inside the upper end of the first liquid receiving portion 55a, and a flow path is formed to leads from the opening to the first drain groove 501a is formed.

Meanwhile, as illustrated in FIG. 3, the inner wall portion 54d includes an extension 54d1 that extends be inclined toward the peripheral edge portion of the holding unit 31. When the first liquid receiving portion 55a is positioned at the retreat position, the first liquid receiving portion 55a abuts onto the extension 54d1 of the inner wall portion 54d, and the opening inside the upper end is closed so that the flow path leading to the first drain groove 501a is closed.

The second cup 50b has the same configuration as the first cup 50a. Specifically, the second cup 50b includes a second peripheral wall portion 54b, a second liquid receiving portion 55b, and a second lifting mechanism 57, and is disposed adjacent to the first peripheral wall portion 54a side of the first cup 50a.

The second peripheral wall portion 54b is erected on the outer peripheral side of the first peripheral wall portion 54a in the bottom portion 53, and formed in a tubular shape. In addition, a space defined between the second peripheral wall portion 54b and the first peripheral wall portion 54a serves as a second drain groove 501b to recover and discharge, for example, the processing liquid.

The second liquid receiving portion 55b is positioned on the outer peripheral side of the first liquid receiving portion 55a, and provided above an upper surface 54b1 of the second peripheral wall portion 54b.

The second lifting mechanism 57 includes a second support member 57a and a second lift driving unit 57b. The second support member 57a is an elongated member. There is provided a plurality of (e.g., three (3)) second support members 57a, only one of which is illustrated in FIG. 3, and movably inserted through an insertion hole formed in the second peripheral wall portion 54b. The second support member 57a may be, for example, a cylindrical rod, but is not limited thereto.

The second support member 57a is positioned such that the upper end is exposed from the upper surface 54b1 of the first peripheral wall portion 54a, and connected to the lower surface of the second receiving portion 55b to support the second liquid receiving portion 55b from the lower side thereof. The upper surface 54b1 of the second peripheral wall portion 54b is positioned to be lower than the upper surface 54a1 of the first peripheral wall portion 54a in the vertical direction.

The second lift driving unit 57b is connected to the lower end of the second support member 57a. The second lift driving unit 57b lifts the second support member 57a, for example, in the Z-axis direction. Accordingly, the second support member 57a lifts the second liquid receiving portion 55b with respect to the second peripheral wall portion 54b.

An air cylinder may be used as the second lift driving unit 57b. Further, the second lift driving unit 57b is also controlled by the control device 4.

In addition, the second liquid receiving portion 55b is also moved between the processing position and the retreat position. Specifically, when the second liquid receiving portion 55b is positioned at the processing position and the first liquid receiving portion 55a is positioned at the retreat position, an opening is formed inside the upper end of the second liquid receiving portion 55b, and a flow path is formed to lead from the opening to the second drain groove 501b.

Meanwhile, as illustrated in FIG. 3, when the second liquid receiving portion 55b is positioned at the retreat position, the second liquid receiving portion 55b abuts onto the first liquid receiving portion 55a, and the opening inside the upper end is closed so that the flow path leading to the second drain groove 501b is closed. In the above description, the second liquid receiving portion 55b at the retreat position abuts onto the first liquid receiving portion 55a, but is not limited thereto. For example, the second liquid receiving portion 55b at the retreat position may abut onto the inner wall portion 54b to close the opening inside the upper end.

The third cup 50c includes a third peripheral wall portion 54c and a third liquid receiving portion 55c, and is disposed adjacent to an opposite side to the first cup 50a across the second cup 50b. The third peripheral wall portion 54c is erected on the outer peripheral side of the second peripheral wall portion 54b in the bottom portion 53, and formed in a tubular shape. In addition, a space defined between the third peripheral wall portion 54c and the second peripheral wall portion 54b serves as a third drain groove 501c to recover and discharge, for example, the processing liquid.

The third liquid receiving portion 55c is formed to be continuous from the upper end of the third peripheral wall portion 54c. The third liquid receiving portion 55c is formed to surround the periphery of the wafer W held by the holding unit 31 and extend up to the upper side of the first liquid receiving portion 55a or the second liquid receiving portion 55b.

In the third liquid receiving portion 55c, when the first and second liquid receiving portions 55a, 55b are positioned at the retreat position as illustrated in FIG. 3, an opening is formed inside the upper end of the third liquid receiving portion 55c, and a flow path is formed to lead from the opening to the third drain groove 501c.

Meanwhile, when the second receiving portion 55b is positioned at the lifted position, or when the first liquid receiving portion 55a and the second liquid receiving portion 55b are positioned at the lifted position, the third liquid receiving portion 55c abuts onto the second liquid receiving portion 55b, and the opening inside the upper end is closed so that the flow path leading to the third drain groove 501c is closed.

In the bottom portion 53 corresponding to the first to third cups 50a to 50c (more precisely, in the bottom portion 53 corresponding to the first to third drain grooves 501a to 501c), drain ports 51a to 51c are formed to be spaced apart from each other in the circumferential direction of the recovery cup 50.

Here, descriptions will be made on a case where the processing liquid discharged from the drain port 51a is an acidic processing liquid, the processing liquid discharged from the drain port 51b is an alkaline processing liquid, and the processing liquid discharged from the drain port 51c is an organic processing liquid. The kind of the processing liquids discharged from the respective drain ports 51a to 51c is merely illustrative, and is not limited thereto.

The drain port 51a is connected to a drain pipe 91a. A valve 62a is interposed in the drain pipe 91a, which is then branched into a first drain pipe 91a1 and a second drain pipe 91a2 at the position of the valve 62a. The valve 62a may be, for example, a three-way valve that is switchable between a valve closing position, a position of opening the discharge path to the first drain pipe 91a1 side, and a position of opening the discharge path to the second drain pipe 91a2 side.

When the acidic processing liquid is re-usable, the first drain pipe 91a1 is connected to the acidic processing liquid source 70b (e.g., a tank that stores the acidic processing liquid), so that the drained liquid returns to the acidic processing liquid source 70b. That is, the first drain pipe 91a1 functions as a circulation line. The second drain pipe 91a2 will be described later.

The drain port 51b is connected to a drain pipe 91b. A valve 62b is interposed in the middle of the drain pipe 91b. In addition, the drain port 51c is connected to a drain pipe 91c. A valve 62c is interposed in the middle of the drain pipe 91c. The valves 62b, 62c are controlled by the control device 4.

In addition, when performing a substrate processing, the processing unit 16 lifts the first liquid receiving portion 55a of the first cup 50a or the second liquid receiving portion 55b of the second cup 50b, depending on the kind of the processing liquid to be used in each processing during the substrate processing, to perform the switching of the drain ports 51a to 51c.

For example, when the wafer W is processed by ejecting the acidic processing liquid to the wafer W, the control device 4 opens the valve 60b in a state of rotating the holding unit 31 at a predetermined rotational speed by controlling the driving unit 33 of the substrate holding mechanism 30.

At this time, the control device 4 moves up the first cup 50a. That is, the control device 4 moves up the first and second support members 56a, 57a by the first and second lift driving units 56b, 57b and moves up the first liquid receiving portion 55a to the processing position, so that a flow path is formed to lead from the opening inside the upper end of the first receiving portion 55a to the first drain groove 501a. Thus, the acidic processing liquid supplied to the wafer W flows downward into the first drain groove 501a.

Further, the control device 4 controls the valve 62a to open the discharge path to the first drain pipe 91a1 side. Thus, the acidic processing liquid flowing into the first drain groove 501a returns to the acidic processing liquid source 70b through the drain pipe 91a and the first drain pipe 91a1. Then, the acidic processing liquid which has returned to the acidic processing liquid source 70b is supplied to the wafer W again. Therefore, the first cup 50a is connected to the circulation line that supplies the recovered acidic processing liquid to the wafer W again.

Further, for example, when the wafer W is processed by ejecting the alkaline processing liquid to the wafer W, the control device 4 similarly opens the valve 60a in a state of rotating the holding unit 31 at a predetermined rotational speed by controlling the driving unit 33.

At this time, the control device 4 moves up the second cup 50b only. That is, the control device 4 moves up the second support member 57a by the second lift driving unit 57b and moves up the second liquid receiving portion 55b to the processing position, so that a flow path is formed to lead from the opening inside the upper end of the second receiving portion 55b to the second drain groove 501b. Here, it is assumed that the first cup 50a is moved down. Thus, the alkaline processing liquid supplied to the wafer W flows downward into the second drain groove 501b.

Further, the control device 4 opens the valve 62b. Thus, the alkaline processing liquid in the second drain groove 501b is discharged to the outside of the processing unit 16 through the drain pipe 91b. Therefore, the drain pipe 91b functions as a drain line that discharges the recovered second processing liquid to the outside of the processing unit 16. That is, the second cup 50b is connected to the drain line.

Further, for example, when the wafer W is processed by ejecting the organic processing liquid to the wafer W, the control device 4 similarly opens the valve 60c in a state of rotating the holding unit 31 at a predetermined rotational speed by controlling the driving unit 33.

At this time, the control device 4 moves down the first and second cups 50a, 50b (see, e.g., FIG. 3). That is, the control device 4 moves down the first and second support members 56a, 57a by the first and second lift driving units 56b, 57b and moves down the first and second liquid receiving portions 55a, 55b to the retreat position. Thus, a flow path is formed to lead from the opening inside the upper end of the first receiving portion 55c to the third drain groove 501c. Thus, the organic processing liquid supplied to the wafer W flows downward into the third drain groove 501c.

Further, the control device 4 opens the valve 62c, so that the organic processing liquid in the third drain groove 501c is discharged to the outside of the processing unit 16 through the drain pipe 91c. Therefore, the third cup 50c is also connected to a drain line that discharges the recovered third processing liquid to the outside of the processing unit 16 (e.g., the drain pipe 91c).

The discharge paths of the acidic processing liquid, the alkaline processing liquid, the organic processing liquid, and the cleaning liquid are illustrative and are not limited thereto. That is, for example, the respective drain ports M a to Mc may be connected to a single drain pipe. The single drain pipes may be provided with a plurality of valves depending on the property of the processing liquid (e.g., acidic or alkaline), and the discharge paths may be branched from the positions of the valves.

Further, the drain pipe 91b is connected with a drain pipe 92a in communication with the insertion hole through which the first support member 56a is inserted into the first peripheral wall portion 54a. The drain pipe 92a discharges, for example, a cleaning liquid infiltrated to the insertion hole of the first peripheral wall portion 54a (to be described later), and the cleaning liquid is discharged to the outside of the processing unit 16 through the drain pipe 91b.

Further, the drain pipe 91c is connected with a drain pipe 92b in communication with the insertion hole through which the second support member 57a is inserted into the second peripheral wall portion 54b. The drain pipe 92b discharges, for example, a cleaning liquid infiltrated to the insertion hole of the second peripheral wall portion 54b, and the cleaning liquid is discharged to the outside of the processing unit 16 through the drain pipe 91c.

Exhaust ports 52a, 52b, 52c are formed in the bottom portion 53 of the recovery cup 50, the first peripheral wall portion 54a, and the second peripheral wall portion 54b, respectively. Further, the exhaust ports 52a, 52b, 52c are connected to a single exhaust pipe, and the exhaust pipe is branched into first to third exhaust pipes 93a to 93c at the downstream side of the exhaust. Further, a valve 64a is interposed in the first exhaust pipe 93a. A valve 64b is interposed in the second exhaust pipe 93b. A valve 64c is interposed in the third exhaust pipe 93c.

The first exhaust pipe 93a is an exhaust pipe for an acidic exhaust. The second exhaust pipe 93b is an exhaust pipe for an alkaline exhaust. The third exhaust pipe 93c is an exhaust pipe for an organic exhaust. These exhaust pipes are switched by the control device 4 depending on each process of the substrate processing.

For example, when performing a processing of generating an acidic exhaust, the switching to the first exhaust pipe 93a is performed by the control device 4, and the acidic exhaust is discharged via the valve 64a. Similarly, when performing a processing of generating an alkaline exhaust, the switching to the second exhaust pipe 93b is performed by the control device 4, and the alkaline exhaust is discharged via the valve 64b. Further, when performing a processing of generating an organic exhaust, the switching to the third exhaust pipe 93c is performed by the control device 4, and the organic exhaust is discharged via the valve 64c.

Hereinafter, in the present exemplary embodiment, it is assumed that BHF (a mixed solution of hydrofluoric acid and ammonium fluoride solution (buffered hydrofluoric acid)) is used as the acidic processing liquid. Further, it is assumed that SC1 (a mixed solution of ammonia, hydrogen peroxide, and water) is used as the alkaline processing liquid, and isopropyl alcohol (IPA) is used as the organic processing liquid. In addition, the kinds of the acidic processing liquid, the alkaline processing liquid, and the organic processing liquid are not limited to those described above.

However, it has been found that when BHF is used in the processing unit 16, the processing liquid atmosphere of the BHF or the scattered BHF is infiltrated into, for example, a gap between the first liquid receiving portion 55a and the first peripheral wall portion 54a, and the atmosphere of the infiltrated BHF is dried so that foreign matters (e.g., crystals of the BHF) are attached to the upper surface 54a1 of the first peripheral wall portion 54a. The foreign matters as described above are not limited to BHF, and other kinds of processing liquids may also be attached thereto.

Therefore, the processing unit 16 according to the exemplary embodiment is configured to supply a cleaning liquid to the upper surface 54a1 of the first peripheral wall portion 54a of the first cup 50a. As a result, the foreign matters (e.g., crystals) attached to the upper surface 54a1 of the first peripheral wall portion 54a may be removed.

<3. Specific Configuration of Cleaning Liquid Supply Unit and First Peripheral Wall Portion>

Figure 4:
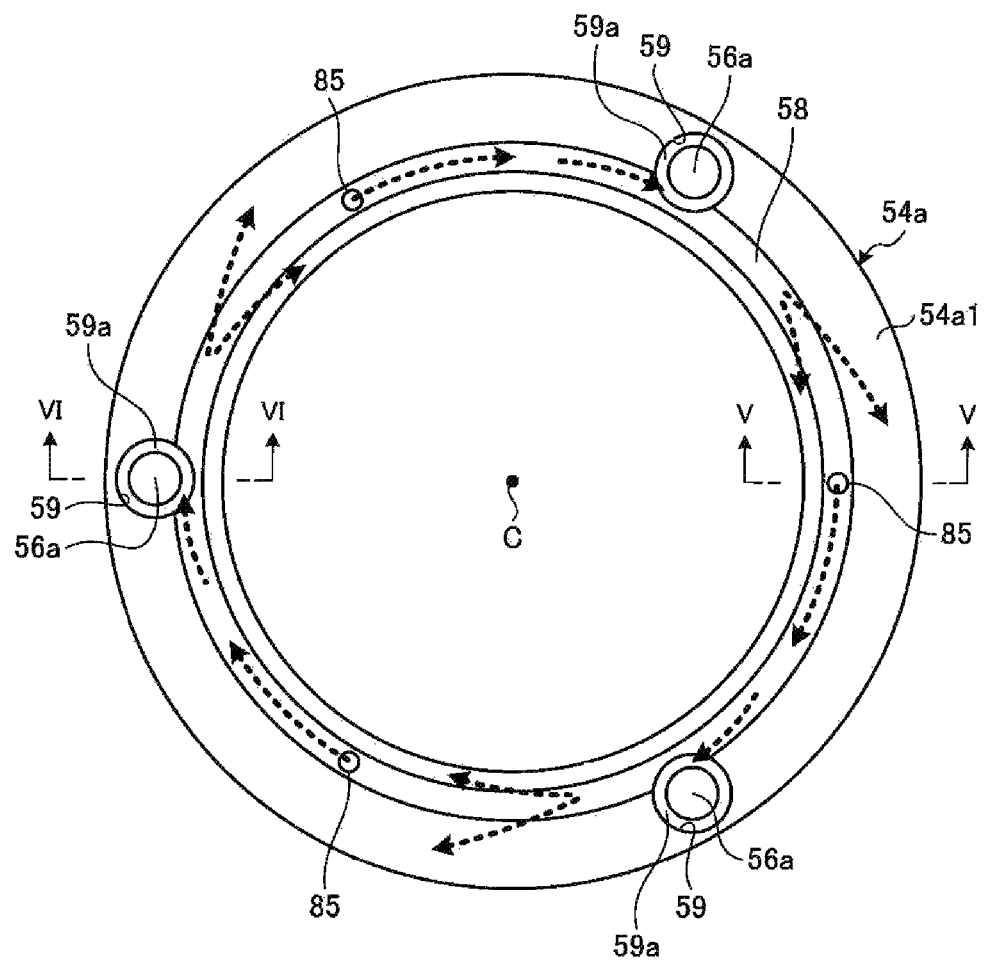
FIG. 4 is a schematic plan view of a first peripheral wall portion.
Figure 5:
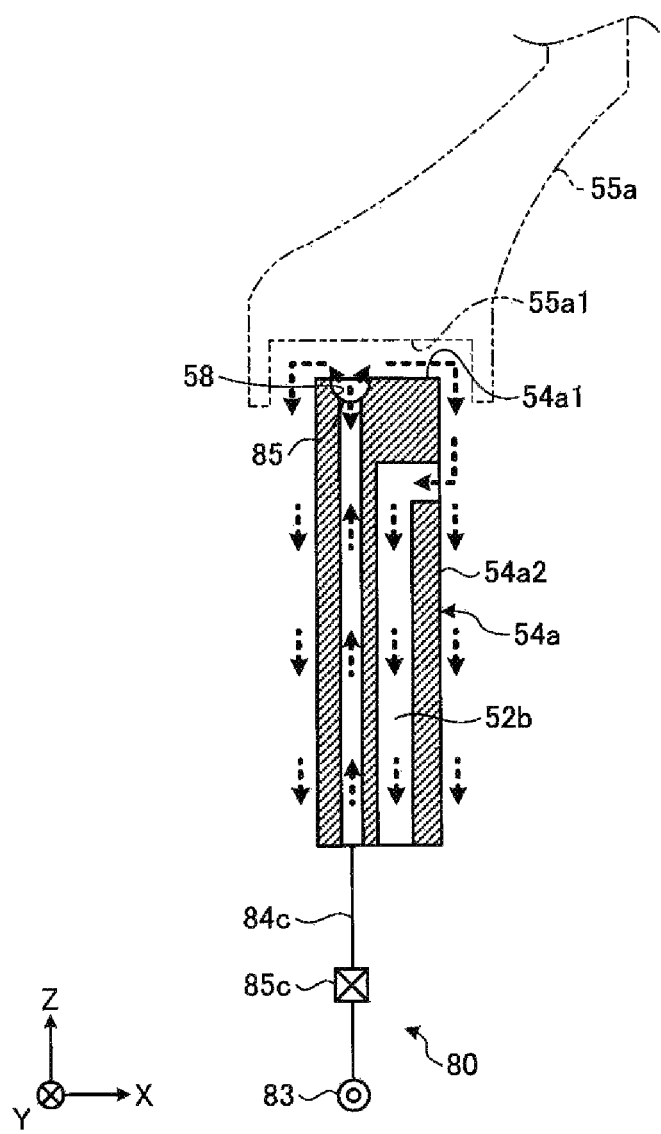
FIG. 5 is a schematic cross-sectional view taken along the line V-V of FIG. 4.

Hereinafter, a configuration of supplying a cleaning liquid to the upper surface 54a1 of the first peripheral wall portion 54a will be described in detail with reference to FIG. 4 and subsequent drawings. FIG. 4 is a schematic plan view of the first peripheral wall portion 54a when viewed from the upper side of the Z-axis. In addition, FIG. 5 is a schematic cross-sectional view taken along the line V-V of FIG. 4. In FIG. 5, the first liquid receiving portion 55a provided on the upper surface 54a1 of the first peripheral wall portion 54a is illustrated by an imaginary line for convenience of understanding.

As illustrated in FIG. 5, the cleaning liquid supply unit 80 of the processing unit 16 further includes a cleaning liquid supply pipe 84c and a valve 85c. One end of the cleaning liquid supply pipe 84c is connected to a cleaning liquid source 83, while the other end thereof is formed with a cleaning liquid ejection port 85 (hereinafter, sometimes referred to as an "ejection port 85").

Further, as illustrated in FIGS. 4 and 5, the first peripheral wall portion 54a includes a groove portion 58. Specifically, the groove portion 58 is formed on the inner peripheral side of the upper surface 54a1 of the first peripheral wall portion 54a, and formed in the circumferential direction on the upper surface 54a1. More specifically, the groove portion 58 is formed in an annular shape in a plan view. The position where the groove portion 58 is formed on the upper surface 54a1 of the first peripheral wall portion 54a may be appropriately changed. For example, the groove portion 58 may be formed to be biased to the outer peripheral side of the upper surface 54a1.

The cleaning liquid supply pipe 84c has a plurality of (e.g., three (3)) ejection ports 85 formed, for example, on the groove portion 58 on the upper surface 54a1 of the first peripheral wall portion 54a. Further, the ejection ports 85 are arranged substantially equidistantly in the circumferential direction around a rotation center C of the holding unit 31. The number and the arrangement position of the ejection ports 85 are illustrative and are not limited thereto.

As illustrated in FIG. 5, the valve 85c is provided in the cleaning liquid supply pipe 84c and is controlled by the control device 4. Therefore, the control device 4 opens the valve 85c when performing the cleaning processing of the upper surface 54a1 of the first peripheral wall portion 54a. Accordingly, the cleaning liquid of the cleaning liquid source 83 is ejected from the ejection ports 85 through the valve 85c and the cleaning liquid supply pipe 84c.

The cleaning liquid supplied from the cleaning liquid supply unit 80, particularly, the cleaning liquid ejected from the ejection ports 85 flows through the groove portion 58 and overflows from the groove portion 58. Then, the cleaning liquid overflowing from the groove portion 58 is supplied over the whole upper surface 54a1 of the first peripheral wall portion 54a. Thus, the upper surface 54a1 is cleaned, thereby removing foreign matters. Further, the cleaning liquid which has cleaned the upper surface 54a1 also flows into, for example, a lateral surface 54a2 of the first peripheral wall portion 54a or the exhaust port 52b, and removes any foreign matters attached thereto.

Therefore, since the first peripheral wall portion 54a is provided with the groove portion 58 formed in the circumferential direction, the cleaning liquid may be supplied over a wide area of the upper surface 54a1 through the groove portion 58. Thus, the upper surface 54a1 may be efficiently cleaned. Further, since the ejection ports 85 are formed in the groove portion 58, it is ensured that the cleaning liquid is capable of being securely supplied to the groove portion 58 and flow therethrough.

Further, as illustrated in FIG. 5, the cleaning processing may be performed in a state where the first liquid receiving portion 55a is moved to the retreat position. That is, the cleaning liquid supply unit 80 may supply the cleaning liquid in a state where the first liquid receiving portion 55a is moved to the retreat position lower than the processing position.

Therefore, since a lower surface 55a1 of the first liquid receiving portion 55a comes closer to the upper surface 54a1 of the first peripheral wall portion 54a, the cleaning liquid flowing through the upper surface 54a1 is also supplied to the lower surface 55a1 of the first liquid receiving portion 55a. Thus, the lower surface 55a1 may also be cleaned by removing foreign matters.

Further, in the cleaning liquid supply unit 80, the flow rate of the cleaning liquid may be changed at the time of cleaning the upper surface 54a1 of the first peripheral wall portion 54a and at the time of cleaning the lower surface 55a1 of the first liquid receiving portion 55a. For example, in the cleaning liquid supply unit 80, the flow rate of the cleaning liquid at the time of cleaning the lower surface 55a1 of the first liquid receiving portion 55a may be increased as compared with the flow rate of the cleaning liquid at the time of cleaning the upper surface 54a1 of the first peripheral wall portion 54a. Therefore, it is ensured that the cleaning liquid is capable of reaching the lower surface 55a1 of the first liquid receiving portion 55a. Thus, the lower surface 55a1 may be efficiently cleaned.

Further, the cleaning processing may be performed in a state where the holding unit 31 and the first and second rotary cups 101, 102 are rotated. That is, the cleaning liquid supply unit 80 may supply the cleaning liquid to the upper surface 54a1 of the first peripheral wall portion 54a in a state where the holding unit 31 and the like are rotated.

As a result, a swirling flow is generated in the recovery cup 50 by the rotation of the holding unit 31 and the first and second rotary cups 101, 102. The swirling flow acts on the cleaning liquid ejected from the ejection ports 85 to cause the cleaning liquid to flow in one direction along the circumferential direction (the clockwise direction in FIG. 4) on the upper surface 54a1 of the first peripheral wall portion 54a, and to increase the flow rate of the cleaning liquid. Therefore, the cleaning liquid may be widely spread on the upper surface 54a1. Thus, the upper surface 54a1 may be efficiently cleaned.

Figure 6A:
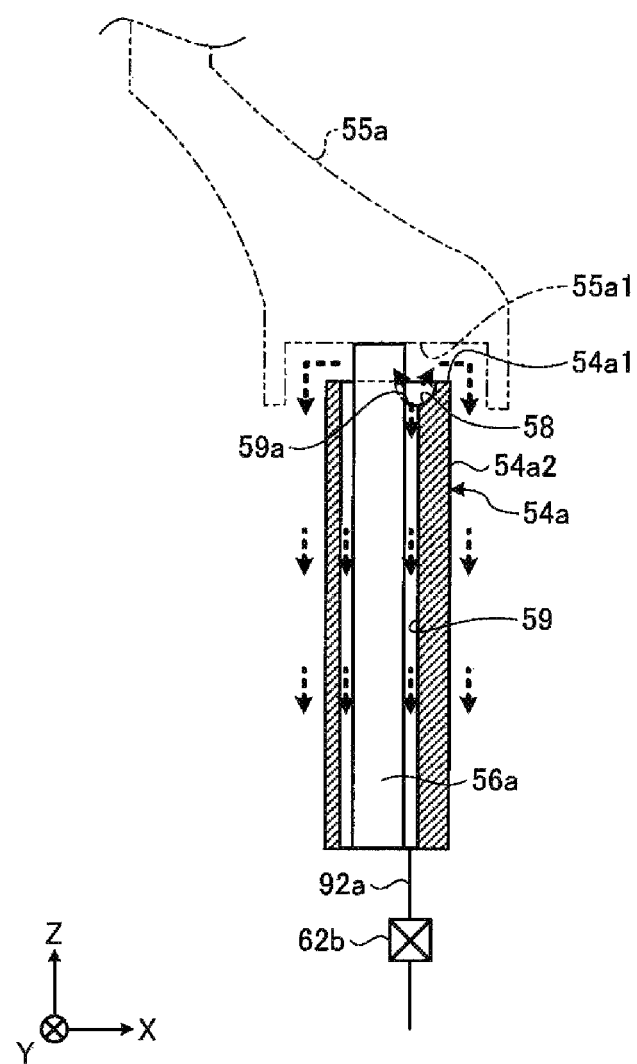
FIG. 6A is a schematic cross-sectional view taken along the line VI-VI of FIG. 4, and illustrating a cleaning status in a state where a first liquid receiving portion is moved down.
Figure 6B:
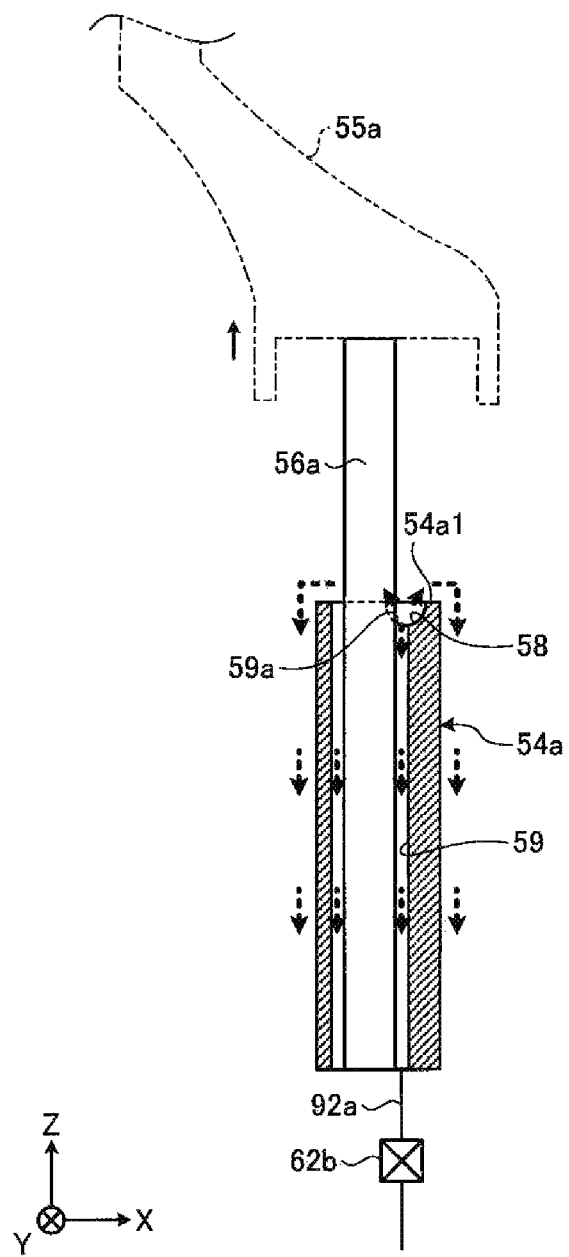
FIG. 6B is a view illustrating a cleaning status in a state where the first liquid receiving portion is moved up.

FIG. 6A is a schematic cross-sectional view taken along the line VI-VI of FIG. 4, and illustrating a cleaning status in a state where the first liquid receiving portion 55a is moved down. In addition, FIG. 6B is a view illustrating a cleaning status in a state where the first liquid receiving portion 55a is moved up. In the exemplary embodiment, the cleaning is performed in both states where the first liquid receiving portion 55a is moved up or down, which will be described later.

As illustrated in FIGS. 6A and 6B, an insertion hole 59 through which the first support member 56a is inserted as described above is formed inside the first peripheral wall portion 54a. The insertion hole 59 includes an opening 59a formed on the upper surface 54a1 of the first peripheral wall portion 54a.

In addition, the opening 59a of the insertion hole 59 according to the exemplary embodiment is formed to overlap with at least a part of the groove portion 58 in a plan view, as illustrated in FIG. 4. Accordingly, the cleaning liquid supply unit 80 supplies the cleaning liquid from the groove portion 58 of the upper surface 54a1 of the first peripheral wall portion 54a to the insertion hole 59 through the opening 59a.

Therefore, as illustrated in FIGS. 6A and 6B, the outer periphery of the first support member 56a and the insertion hole 59 may be cleaned so that foreign matters attached to the outer periphery of the first support member 56a and the insertion hole 59 may also be removed. The cleaning liquid flowing into the insertion hole 59 is discharged to the outside of the processing unit 16 through the drain pipe 92a and the valve 62b.

<4. Specific Configuration of Substrate Processing System>

Next, descriptions will be made on the contents of a substrate processing performed in the substrate processing system 1 according to the exemplary embodiment with reference to FIG. 7.

Figure 7:
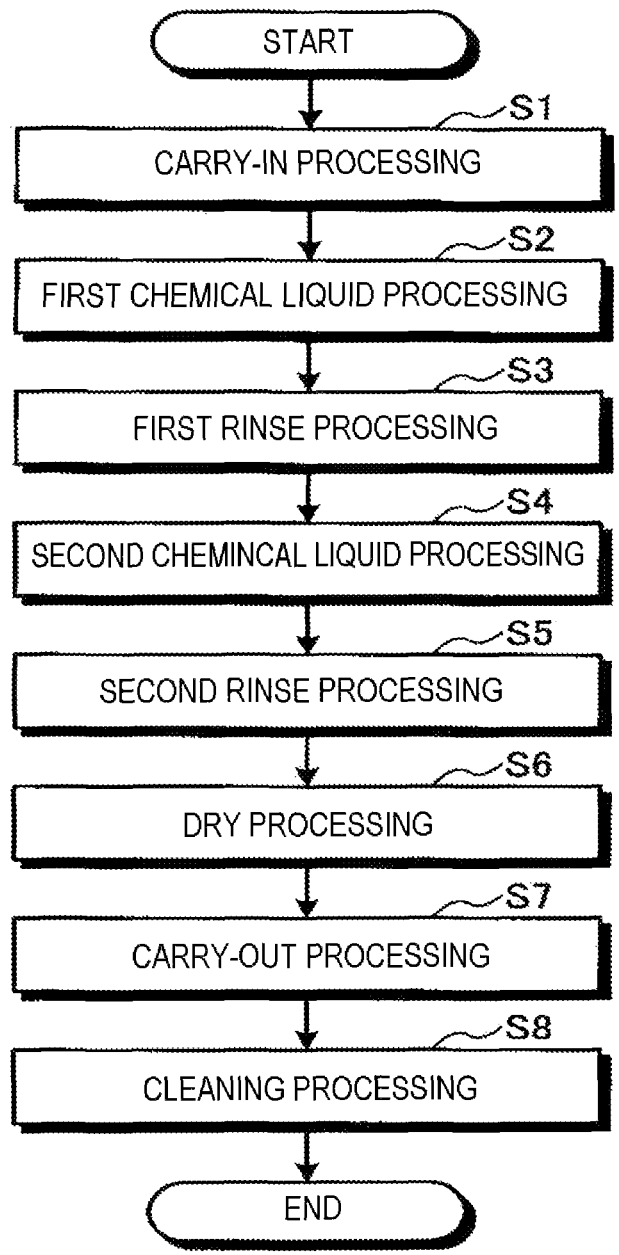
FIG. 7 is a flowchart illustrating a processing procedure of the processing performed in the substrate processing system according to the first exemplary embodiment.

FIG. 7 is a flowchart illustrating a processing procedure of the processing performed in the substrate processing system 1 according to the exemplary embodiment. The processing procedure illustrated in FIG. 7 is performed according to the control of the controller 18 of the control device 4.

As illustrated in FIG. 7, the processing unit 16 first performs a carry-in processing of a wafer W (step S1). In the carry-in processing, the wafer W is placed on the holding unit 31 by the substrate transfer device 17 (see, e.g., FIG. 1), and the wafer W is then held by the holding unit 31.

Subsequently, the processing unit 16 performs a first chemical liquid processing (step S2). In the first chemical liquid processing, the controller 18 first causes the driving unit 33 to rotate the holding unit 31 so that the wafer W is rotated. Subsequently, the controller 18 opens the valve 60a for a predetermined time period to supply SC1 from the nozzle 41 to the front surface of the wafer W. Thus, the front surface of the wafer W is processed with the SC1.

Subsequently, the processing unit 16 performs a first rinse processing (step S3). In the first rinse processing, the controller 18 opens the valve 60d for a predetermined time period to supply DIW from the nozzle 41 to the wafer W. Thus, the SC1 remaining on the wafer W is washed out with the DIW.

Next, the processing unit 16 performs a second chemical liquid processing (step S4). In the second chemical liquid processing, the controller 18 opens the valve 60b for a predetermined time period to supply BHF from the nozzle 41 to the front surface of the wafer W. Thus, the front surface of the wafer W is processed with the BHF.

Subsequently, the processing unit 16 performs a second rinse processing (step S5). In the second rinse processing, the controller 18 opens the valve 60d for a predetermined time period to supply DIW from the nozzle 41 to the front surface of the wafer W. Thus, the BHF remaining on the wafer W is washed out with the DIW.

Next, the processing unit 16 performs a dry processing (step S6). In the dry processing, the controller 18 opens the valve 60c for a predetermined time period to supply IPA from the nozzle 41 to the front surface of the wafer W. Thus, the DIW remaining on the front surface of the wafer W is replaced with the IPA which is more volatile than the DIW. Thereafter, the IPA on the wafer W is shaken off so that the wafer W is dried.

Subsequently, the processing unit 16 performs a carry-out processing (step S7). In the carry-out processing, the controller 18 stops the rotation of the wafer W caused by the driving unit 33, and then, the wafer W is carried out of the processing unit 16 by the substrate transfer device 17 (see, e.g., FIG. 1). When the carry-out processing is completed, a series of substrate processings on one wafer W is completed.

Next, the processing unit 16 performs a cleaning processing to clean the upper surface 54a1 of the first peripheral wall portion 54a (step S8). The cleaning processing is not required to be performed whenever one wafer W is carried out. That is, a timing of performing the cleaning processing may be arbitrarily set. For example, the cleaning processing may be performed once after the substrate processing is performed on a plurality of wafers W. Further, the cleaning of the substrate holding mechanism 30 may be performed at the time of the processing of step S8.

Figure 8:
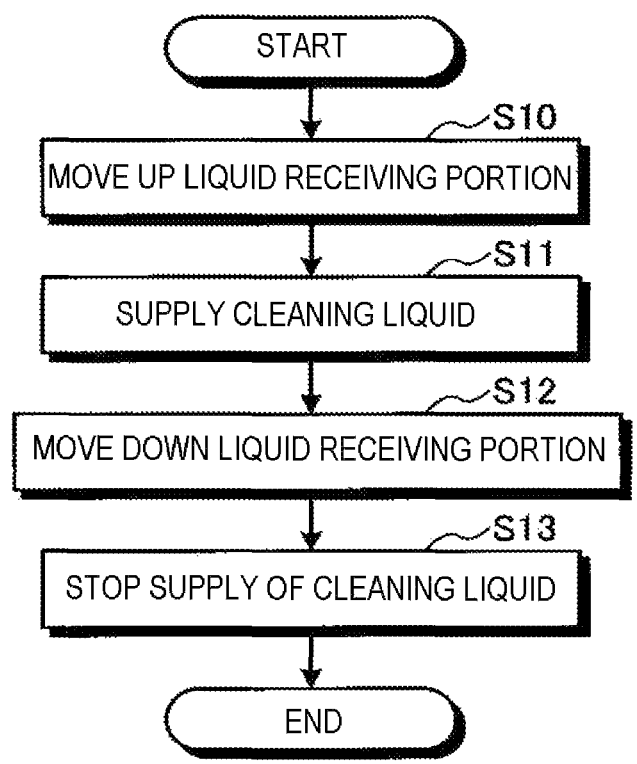
FIG. 8 is a flowchart illustrating an exemplary processing procedure of a cleaning processing of the first peripheral wall portion performed in the substrate processing system.

The cleaning processing of the first peripheral wall portion 54a will be described with reference to FIG. 8. FIG. 8 is a flowchart illustrating an exemplary processing procedure of the cleaning processing of the first peripheral wall portion 54a performed in the substrate processing system 1.

The controller 18 of the control device 4 causes the first lift driving unit 56b to move up the first support member 56a and move up the first liquid receiving portion 55a (step S10, see, e.g., FIG. 6B). Subsequently, the controller 18 opens the valve 85c of the cleaning liquid supply unit 80 to supply a cleaning liquid to the upper surface 54a1 of the first peripheral wall portion 54a (step S11).

Subsequently, when a predetermined time has elapsed after the cleaning liquid was supplied, the controller 18 causes the first lift driving unit 56b to move down the first support member 56a and move the first liquid receiving portion 55a to the retreat position (step S12, see, e.g., FIG. 6A).

Thus, when the first liquid receiving portion 55a is at the retreat position, the lower surface 55a1 of the first liquid receiving portion 55a may also be cleaned. Further, during the cleaning processing, lifting the first liquid receiving portion 55a enables the first support member 56a to be moved inside the insertion hole 59 which is filled with the cleaning liquid. Thus, foreign matters attached to the outer periphery of the first support member 56a may be efficiently removed. The lifting operation of the first liquid receiving portion 55a may be repeated a plurality of times.

Subsequently, when a predetermined time has elapsed after the first liquid receiving portion 55a moved down, the controller 18 closes the valve 85c of the cleaning liquid supply unit 80 to stop the supply of the cleaning liquid to the upper surface 54a1 of the first peripheral wall portion 54a (step S13). Therefore, the cleaning processing of the first peripheral wall portion 54a is completed.

The controller 18 may perform the cleaning processing in a state where the holding unit 31 and the first and second rotary cups 101, 102 are rotated. As described above, a swirling flow is generated by rotating the holding portion or the like, so that the cleaning liquid is widely spread on the upper surface 54a1.

As described above, the processing unit 16 according to the first exemplary embodiment (corresponding to an example of the "substrate processing apparatus") includes the holding unit 31, the processing fluid supply unit 40 (corresponding to an example of the "processing liquid supply unit"), the recovery cup 50, and the cleaning liquid supply unit 80. The holding unit 31 holds the wafer W. The processing fluid supply unit 40 supplies a processing fluid onto the wafer W.

The first cup 50a of the recovery cup 50 includes the bottom portion 53, the tubular first peripheral wall portion 54a erected on the bottom portion 53, the first liquid receiving portion 54a provided above the first peripheral wall portion 54a and configured to receive the processing liquid scattered from the substrate W, and the groove portion 58 formed in the circumferential direction on the upper surface of the first peripheral wall portion 54a, and surrounds the holding unit 31. The cleaning liquid supply unit 80 supplies a cleaning liquid to the upper surface 54a1 of the first peripheral wall portion 54a. As a result, foreign matters attached to the upper surface 54a1 of the first peripheral wall portion 54a may be removed.

<5. Modification>

Next, descriptions will be made on first to fourth modifications of the processing unit 16 according to the first exemplary embodiment. In the processing unit 16 in the first modification, the shape of the groove portion 58 formed in an annular shape in the first embodiment is changed.

Figure 9:
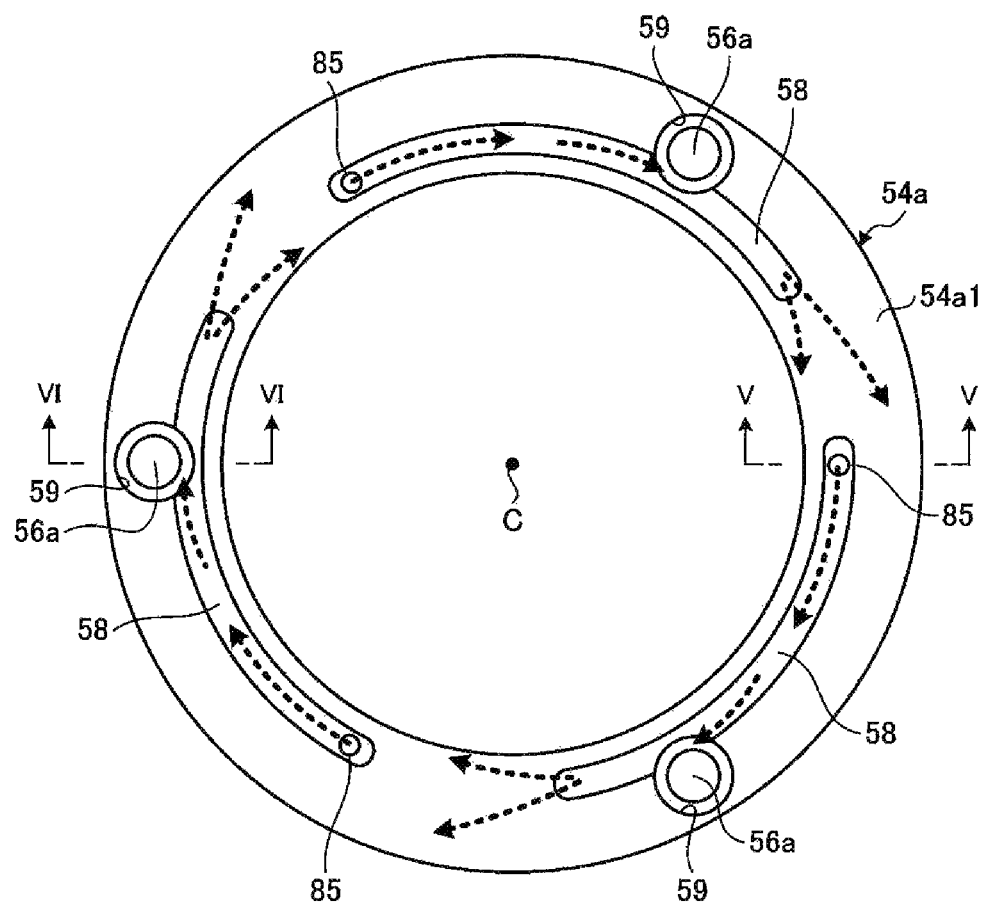
FIG. 9 is a schematic plan view of a first peripheral wall portion according to a first modification.
Figure 9:
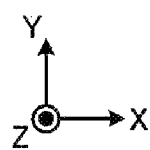

FIG. 9 is a schematic plan view of the first peripheral wall portion 54a of the first modification when viewed from the upper side of the Z-axis. As illustrated in FIG. 9, in the first modification, the groove portion 58 is divided into a plurality of (three (3) in FIG. 9) portions, and the divided groove portions 58 are formed in the circumferential direction on the upper surface 54a1 of the first peripheral wall portion 54a.

Further, each of the divided groove portions 58 is formed with an ejection port 85 of the cleaning liquid. The position where the ejection port 85 is formed may be, for example, near an end portion on the upstream side of the flow direction of the cleaning liquid in each of the groove portions 58. Thus, the cleaning liquid may flow from the end portion of the groove portion 58. Therefore, the cleaning liquid overflowing from the groove portion 58 while flowing through the groove portion 58 is widely spread on the upper surface 54a1. Thus, the upper surface 54a1 may be efficiently cleaned. The position where the ejection port 85 is formed in the groove portion 58 is not limited thereto.

Figure 10:
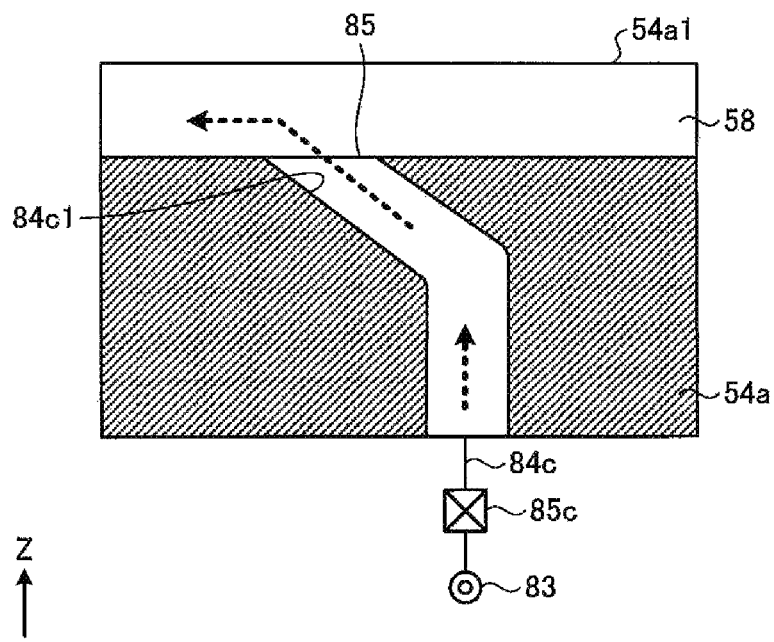
FIG. 10 is a vertical-sectional view illustrating a periphery of an ejection port of a cleaning liquid supply pipe according to a second modification, in an enlarged scale.

Next, a second modification will be described. In the processing unit 16 according to the second modification, the direction of the ejection port 85 of the cleaning liquid supply unit 80 is changed. FIG. 10 is a vertical-sectional view illustrating a periphery of the ejection port 85 of the cleaning liquid supply pipe 84c in the second modification, in an enlarged scale.

As illustrated in FIG. 10, in the second modification, the ejection port 85 is connected with a cleaning liquid supply path 84c1 through which the cleaning supplied from the cleaning liquid supply pipe 84c flows. The cleaning liquid supply path 84c1 is configured to be inclined in the circumferential direction of the first peripheral wall portion 54a (the left-right direction of the paper in FIG. 10) such that the ejection direction of the ejection port 85 is tilted with respect to the Z-axis direction. In other words, the cleaning liquid supply path 84c1 is formed such that the ejection direction of the cleaning liquid from the ejection port 85 is directed to one direction along the circumferential direction on the upper surface 54a1 of the first peripheral wall portion 54a. Here, the wording "one direction" is the same direction as the direction of the force acting on the cleaning liquid by the swirling flow of the first and second rotary cups 101, 102, that is, the clockwise direction in FIG. 4.

Therefore, the cleaning liquid may flow in one direction along the circumferential direction on the upper surface 54a1 of the first peripheral wall portion 54a with or without the swirling flow. Thus, the cleaning liquid may by more widely spread on the upper surface 54a1, which may, in turn, be efficiently cleaned.

Further, in the processing unit 16, the flow rate of the cleaning liquid ejected from the ejection port 85 of the cleaning liquid supply unit 80 may be changed depending on a portion to be cleaned (a cleaning target portion) among the upper surface 54a1 of the first peripheral wall portion 54a.

Figure 11:
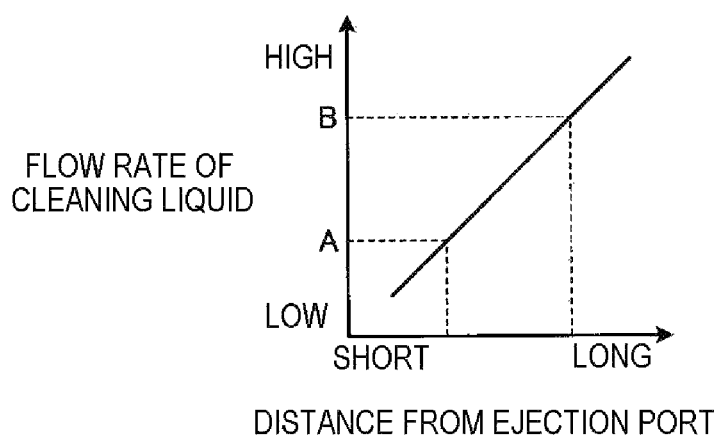
FIG. 11 is a view illustrating an exemplary relationship between a distance of a cleaning target portion from the ejection port and a flow rate of the cleaning liquid.

FIG. 11 is a view illustrating an exemplary relationship between a distance of the cleaning target portion from the ejection port 85 and a flow rate of the cleaning liquid. As illustrated in FIG. 11, when the distance from the ejection port 85 to the cleaning target portion is relatively short, that is, in a case of cleaning, for example, the periphery of the ejection port 85, a flow rate A of the cleaning liquid becomes a relatively small value. Therefore, the cleaning liquid is supplied to the periphery of the ejection port 85 in a relatively large amount, so that the periphery of the ejection port 85 may be efficiently cleaned.

Meanwhile, when the distance from the ejection port 85 to the cleaning target portion is relatively long, that is, in a case of cleaning, for example, the periphery of the first support member 56a relatively far from the ejection port 85, a flow rate B of the cleaning liquid becomes relatively large value, as compared with the case of cleaning the periphery of the ejection port 85. Therefore, the cleaning liquid is supplied to, for example, the periphery of the first support member 56a in a relatively large amount, so that the periphery of the first support member 56a may be efficiently cleaned.

Thus, since the flow rate of the cleaning liquid ejected from the ejection port 85 is changed depending on the cleaning target portion among the upper surface 54a1 of the first peripheral wall portion 54a, it is also possible to perform a local cleaning on the upper surface 54a1.

In the example illustrated in FIG. 11, as the distance from the ejection port 85 to the cleaning target portion is increased, the flow rate of the cleaning liquid is successively increased, but this is illustrative and is not limited thereto. That is, the method of increasing the flow rate of the cleaning liquid may be arbitrarily changed, for example, to a method of increasing the flow rate of the cleaning liquid in stages (stepwise).

Figure 12A:
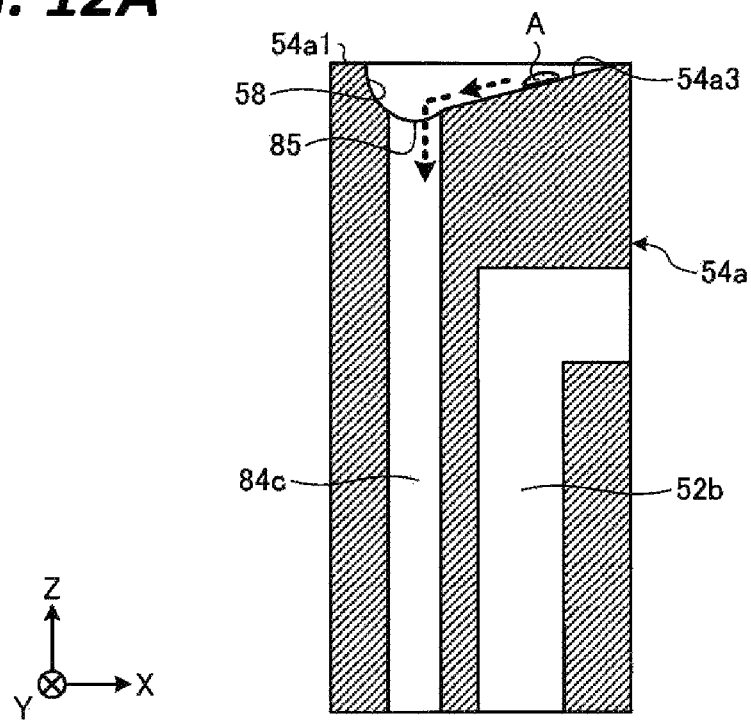
FIG. 12A is a schematic cross-sectional view illustrating a first peripheral wall portion according to a third modification.

Next, a third modification will be described. FIG. 12A is a schematic cross-sectional view illustrating the first peripheral wall portion 54a according to a third modification.

As illustrated in FIG. 12A, the first peripheral wall portion 54a of the third modification includes an inclined portion 54a3. The inclined portion 54a3 is formed on the upper surface 54a1 to have a downward slope toward the groove portion 58. Thus, for example, even though a cleaning liquid A remains on the upper surface 54a1 after the cleaning processing, the remaining cleaning liquid A flows into the cleaning liquid supply pipe 84c along the inclined portion 54a3.

In the third modification, since the inclined portion 54a3 is provided in this manner, the remaining cleaning liquid A scarcely stays on the upper surface 54a1. Therefore, in the substrate processing performed after the cleaning processing, reduction in concentration of the processing liquid may be suppressed.

That is, for example, if the cleaning liquid A remains on the upper surface 54a1, the cleaning liquid A may be incorporated into a cleaning liquid in the substrate processing after the cleaning processing. Thus, the concentration of the processing liquid may be reduced. In the third modification, however, since the inclined portion 54a3 is provided as described above, reduction in concentration of the processing liquid may be suppressed.

Figure 12B:
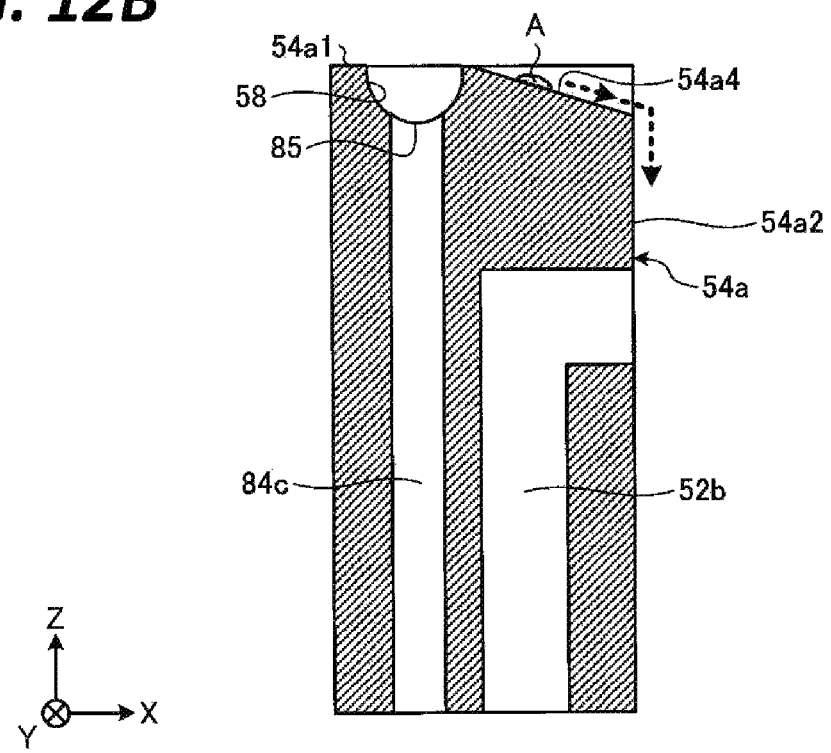
FIG. 12B is a schematic cross-sectional view illustrating a first peripheral wall portion according to a fourth modification.

Next, a fourth modification will be described. In the third modification, the inclined portion 54a3 is formed so as to have a downward slope toward the groove portion 58, but the shape of the inclined portion is not limited thereto. FIG. 12B is a schematic cross-sectional view illustrating the first peripheral wall portion 54a according to the fourth modification.

As illustrated in FIG. 12B, an inclined portion 54a4 according to the fourth modification is formed on the upper surface 54a1 of the first peripheral wall portion 54a so as to have a downward slope toward the lateral surface 54a2 of the first peripheral wall portion 54a.

Thus, for example, the cleaning liquid A remaining on the upper surface 54a1 after the cleaning processing flows to the lateral surface 54a2 along the inclined portion 54a4, and is then discharged. Accordingly, in the fourth modification, since the inclined portion 54a4 is provided similarly to the third modification, the remaining cleaning liquid A scarcely stays on the upper surface 54a1, and thus, reduction in concentration of the processing liquid may be suppressed in the substrate processing performed after the cleaning processing.

Second Exemplary Embodiment

Subsequently, a substrate processing system 1 according to a second exemplary embodiment will be described. In the following descriptions, portions identical to the already described portions will be denoted by the same reference numerals, and overlapping descriptions thereof will be omitted.

The second exemplary embodiment has a configuration in which the processing liquid is suppressed from splashing onto the rotation center C side on the rear surface side of the holding unit 31. Hereinafter, the configuration will be described with reference to FIG. 13 and the subsequent drawings.

Figure 13:
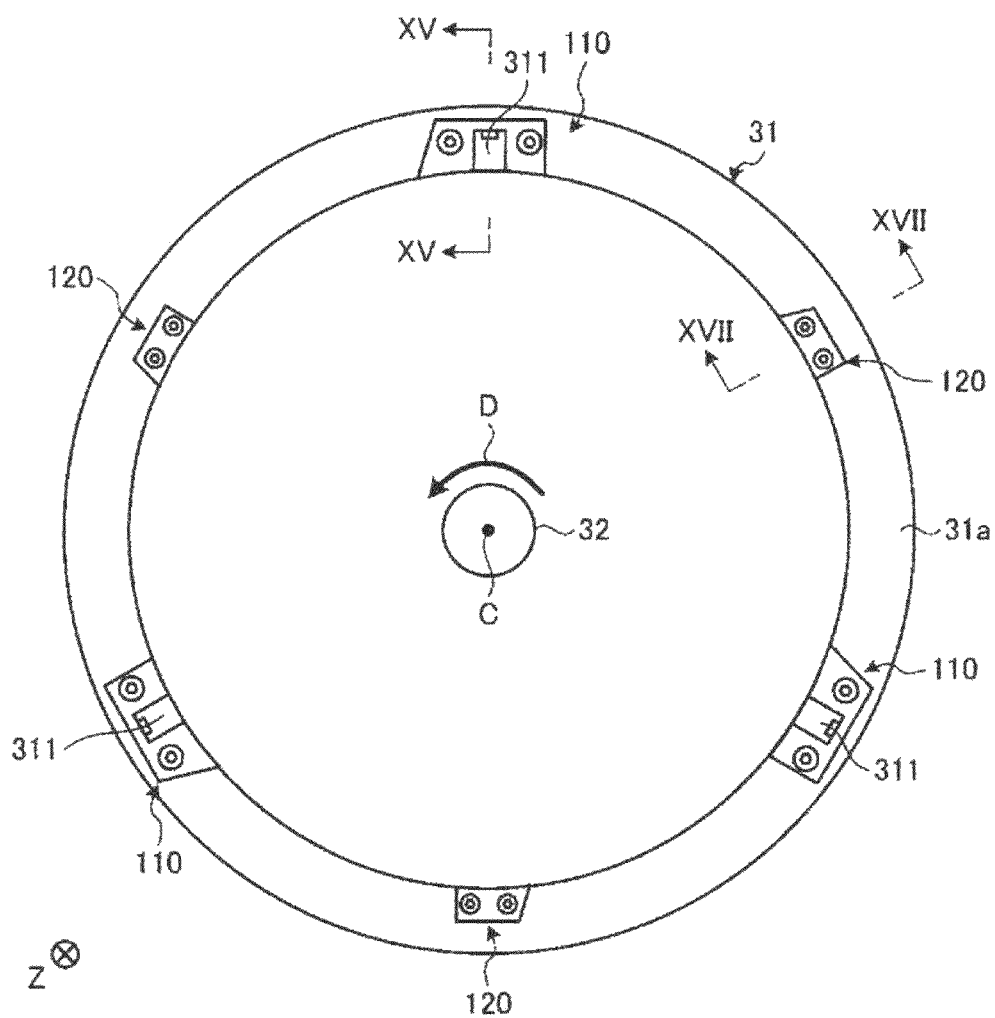
FIG. 13 is a schematic bottom view of a rear surface of a holding unit according to a second exemplary embodiment.

FIG. 13 is a schematic bottom view of a rear surface 31a of the holding unit 31 when viewed from the lower side of the Z-axis. As illustrated in FIG. 13, the rear surface 31a of the holding unit 31 is provided thereon with a first fixing portion 110 that fixes the holding member 311 to the holding unit 31, and a second fixing portion 120 that fixes a wafer W supporting pin 312 (see, e.g., FIG. 17) to the holding unit 31.

There are provided a plurality of (three (3) in the example of FIG. 13) first fixing portions 110 and a plurality of (three (3) in the example of FIG. 13) second fixing portion 120. Further, the first and second fixing portions 110, 120 are arranged substantially equidistantly in the circumferential direction around the rotation center C of the holding unit 31. The number and the arrangement positions of the first and second fixing portions 110, 120 are illustrative and are not limited thereto.

Figure 14A:
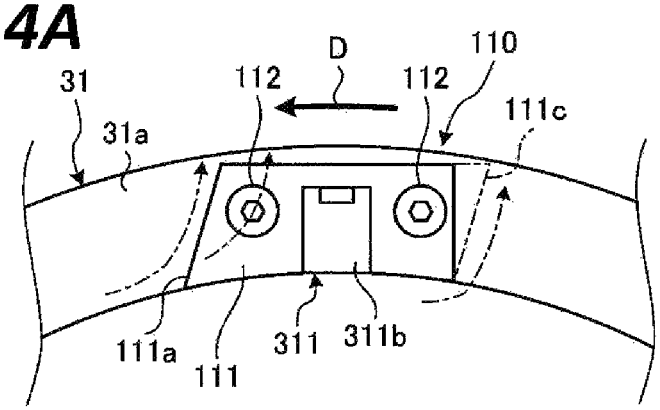
FIG. 14A is a schematic bottom view illustrating a first fixing portion in an enlarged scale.
Figure 14B:
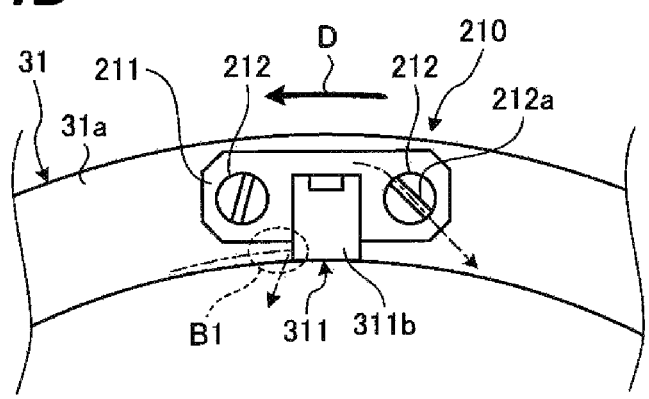
FIG. 14B is a schematic bottom view illustrating a first fixing portion according to a comparative example.

FIG. 14A is a schematic bottom view illustrating the first fixing portion 110 in an enlarged scale. FIG. 14B is a schematic bottom view illustrating a first fixing portion 210 according to a comparative example. Further, FIG. 15 is a cross-sectional view taken along the line XV-XV of FIG. 13.

Figure 15:
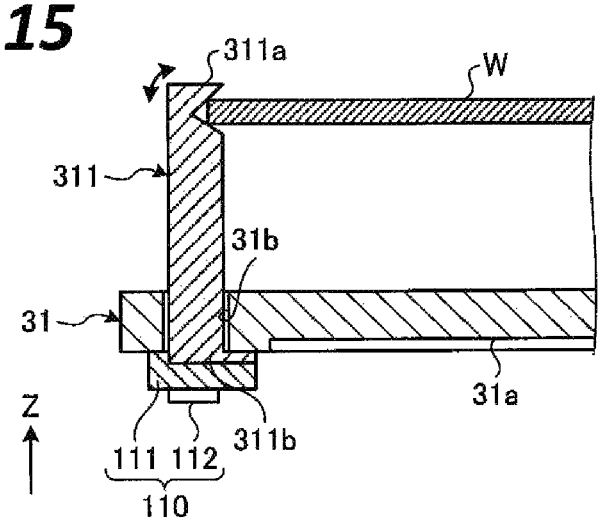
FIG. 15 is a cross-sectional view taken along the line XV-XV of FIG. 13.

As illustrated in FIG. 15, the holding member 311 is positioned to be inserted through the insertion hole 31b of the holding unit 31, and holds the wafer W by clipping the wafer W in a cutout portion on one end 311a side. Further, the other end 311b of the holding member 311 is exposed to the rear surface 31a side of the holding unit 31, and the other end 311b is fixed by the first fixing portion 110.

Prior to continuing the description of the first fixing portion 110, a first fixing portion 210 according to a comparative example will be described with reference to FIG. 14B. As illustrated in FIG. 14B, the first fixing portion 210 in the comparative example includes a main body 211 that partially clamps both lateral surfaces of the other end 311b of the holding portion 31, and a screw 212 that fastens and fixes the main body 211 to the holding unit 31.

In the main body 211, the other end 311b protrudes toward the rotation center C side of the holding unit 31 (see, e.g., FIG. 13) at the position where the other end 311b of the holding unit 31 is clamped. Further, a slotted screw is used as the screw 212.

When the first fixing portion 210 is configured as described above, for example, the processing liquid may splash toward the rotation center C side of the holding unit 31, so that foreign matters (e.g., crystals of the processing liquid) may be attached to the periphery of the first fixing portion 210.

That is, when the holding unit 31 is rotated in a rotational direction D, as illustrated by a closed curve B1 indicated by the broken line in FIG. 14B, the scattered processing liquid may crash into a portion protruding from the main body 211 and splash toward the rotation center C side of the holding unit 31.

Further, when the screw 212 is a slotted screw, the processing liquid may pass through a minus groove 212a depending on the direction of the minus groove 212a, and splash toward the rotation center C side of the holding unit 31. The processing liquid, which has splashed as described above, may be dried on the rear surface 31a of the holding unit 31 and attached thereto as a foreign matter such as, for example, a crystal.

Therefore, the first fixing portion 110 according to the second exemplary embodiment is configured to suppress the liquid from splashing as described above. Specifically, as illustrated in FIG. 14A, the first fixing portion 110 includes a main body 111 and a screw 112.

The main body 111 clamps both lateral surfaces of the other end 311b of the holding unit 31. That is, it is configured such that the other end 311b of the holding unit 31 does not protrude at the position of the main body 111 that clamps the holding unit 31. Therefore, the processing liquid may be suppressed from crashing into the main body 111 and splashing therefrom.

Further, in the main body 111, an inclined guide portion 111a is formed on a lateral surface into which the scattered processing readily crashes (i.e., on a lateral surface on the rotation direction D side) to guide the processing liquid to the outside of the holding unit 31. Therefore, the scattered processing liquid flows to the outside of the holding unit 31 by the inclined guide portion 111a, and thus, the processing liquid is suppressed from splashing.

Further, a hexagonal screw is used as the screw 112. Therefore, the processing liquid may be suppressed from passing through the groove in the head of the screw 112 and splashing onto the rotation center C side of the holding unit 31. The screw 112 is not limited to the hexagonal screw, but any kind of screws may be used as long as a groove through which the processing liquid flows is not formed in the head.

As indicated by the imaginary line in FIG. 14A, in the main body 111, an inclined guide portion 111c may be formed on a lateral surface opposite to the lateral surface where the inclined guide portion 111a is formed. Therefore, the scattered processing liquid flows to the outside of the holding unit 31 by the inclined guide portion 111c, and thus, the processing liquid is further suppressed from splashing.

Figure 16:
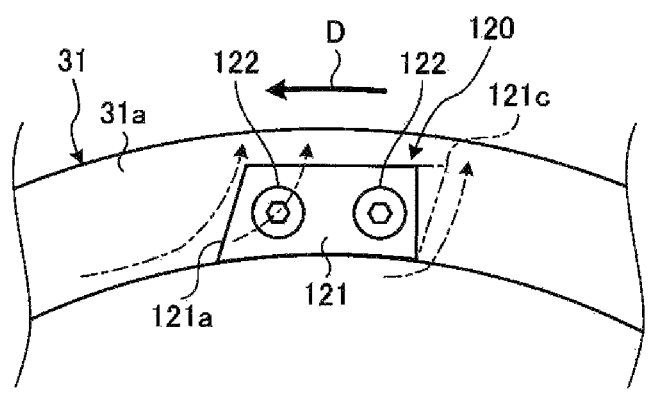
FIG. 16 is a schematic bottom view illustrating a second fixing portion in an enlarged scale.
Figure 17:
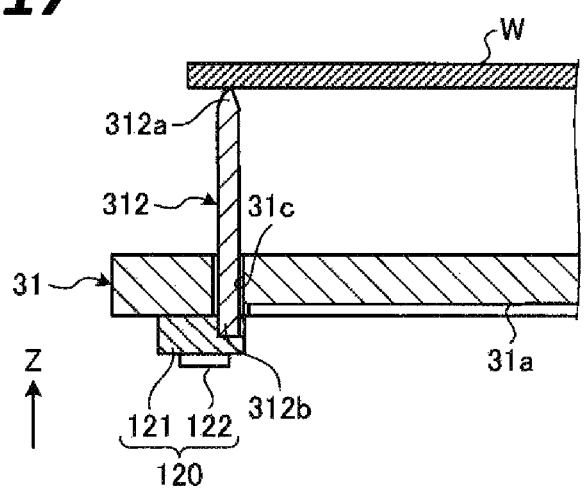
FIG. 17 is a cross-sectional view taken along the line XVII-XVII of FIG. 13.

Subsequently, the second fixing portion 120 will be described with reference to FIGS. 16 and 17. FIG. 16 is a schematic bottom view illustrating the second fixing portion 120 in an enlarged scale. FIG. 17 is a cross-sectional view taken along the line XVII-XVII of FIG. 13.

As illustrated in FIG. 17, the wafer W supporting pin 312 is a member that supports the wafer W from the lower side thereof. Specifically, the supporting pin 312 is positioned to be inserted through an insertion hole 31c of the holding unit 31, and supports the wafer W on one end 312a side. Further, the other end 312b of the supporting pin 312 protrudes to the rear surface 31a side of the holding unit 31, and the other end 312b is fixed by the second fixing portion 120.

Therefore, the first fixing portion 120 according to the second exemplary embodiment is configured to suppress the liquid from splashing as described above. Specifically, as illustrated in FIG. 16, the second fixing portion 120 includes a main body 121 and a screw 122.

The main body 121 has a tetragonal shape in a bottom view. Therefore, the processing liquid may be suppressed from crashing into the main body 121 and splashing therefrom.

Further, in the main body 121, an inclined guide portion 121a is formed on a lateral surface into which the scattered processing easily crashes, that is, on a lateral surface on the rotation direction D side, to guide the processing liquid to the outside of the holding unit 31. Therefore, the scattered processing liquid flows to the outside of the holding unit 31 by the inclined guide portion 121a, and thus, the processing liquid is suppressed from splashing.

Further, a hexagonal screw is used as the screw 122. Therefore, the liquid may be suppressed from splashing toward the rotation center C side of the holding unit 31. Similarly to the screw 112, the screw 122 is not limited to the hexagonal screw.

As indicated by the imaginary line in FIG. 16, in the main body 121, an inclined guide portion 121c may be formed on a lateral surface opposite to the lateral surface where the inclined guide portion 121a is formed. Therefore, the scattered processing liquid flows to the outside of the holding unit 31 by the inclined guide portion 121c, and thus, the processing liquid is further suppressed from splashing.

Third Exemplary Embodiment

Figure 18:
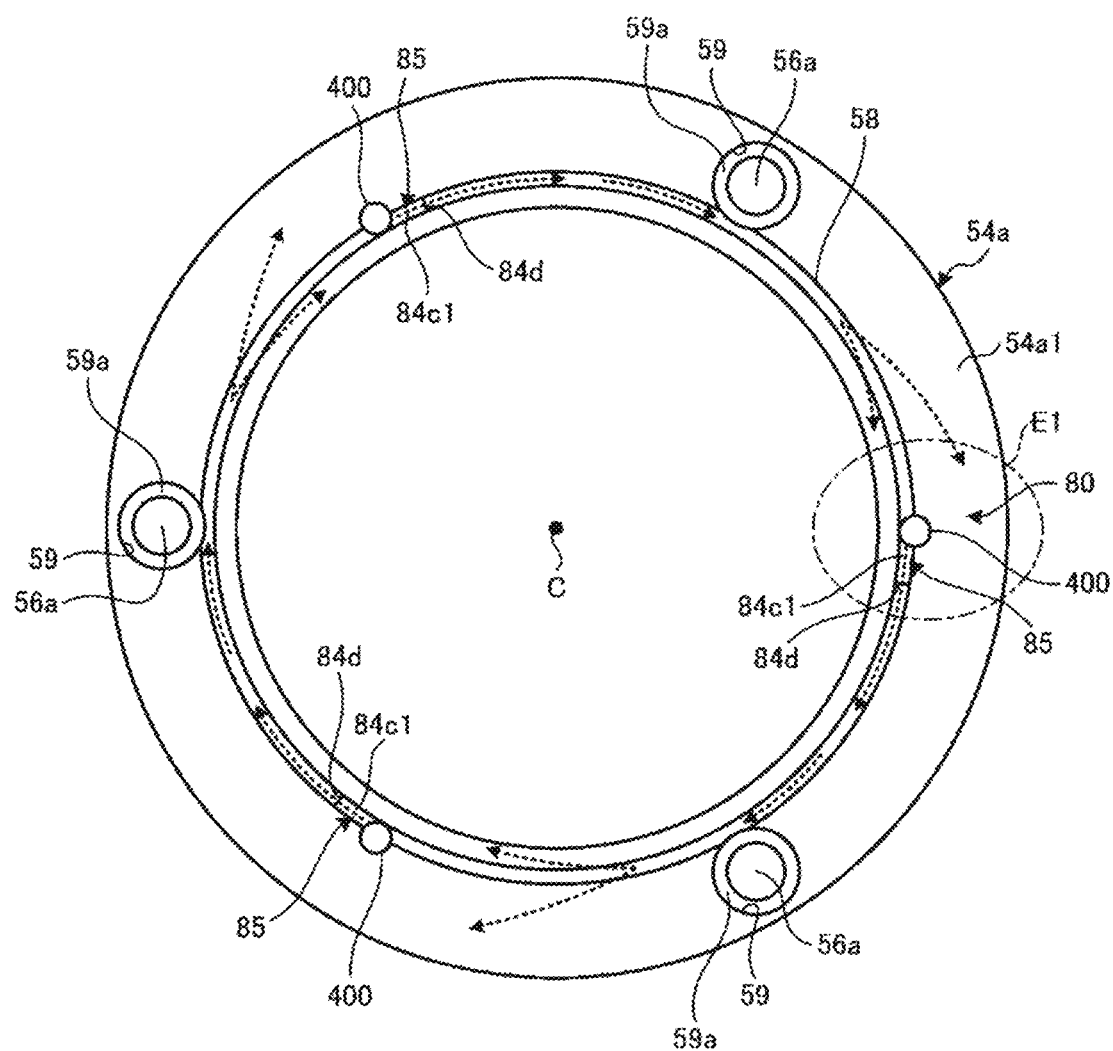
FIG. 18 is a schematic plan view of a first peripheral wall portion according to a third exemplary embodiment.
Figure 18:
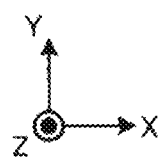

Subsequently, descriptions will be made on the cleaning liquid supply unit 80 of the processing unit 16 according to a third exemplary embodiment. FIG. 18 is a schematic plan view of a first peripheral wall portion 54a according to the third exemplary embodiment. As illustrated in FIG. 18, in the third exemplary embodiment, the ejection port 85 is an opening formed over a predetermined range on the bottom surface of the groove portion 58. The boundary between the ejection port 85 and the groove portion 58 includes an upper end edge 84d in the inclined portion of the cleaning liquid supply path 84c1 (see, e.g., FIGS. 19 and 20 to be described later), but is not limited thereto. Further, the ejection port 85 is formed such that the opening area is larger than an area of the flow path of the cleaning liquid supply pipe 84c (see, e.g., FIG. 20).

In addition, an intermediate portion 400 is provided between the ejection port 85 and the cleaning liquid supply pipe 84c to weaken a hydropower of the cleaning liquid from the cleaning liquid supply pipe 84c, and to tilt the ejection direction of the ejection port 85 such that the flow path of the cleaning liquid from the cleaning liquid supply pipe 84c is directed to the groove portion 58. In other words, the intermediate portion 400 has a function as a buffer that weakens the hydropower of the cleaning liquid supplied from the cleaning liquid supply pipe 84c to a hydropower suitable for being supplied to the upper surface 54a1 or the groove portion 58, as well as a function to change the direction of the flow path of the cleaning liquid.

Figure 19:
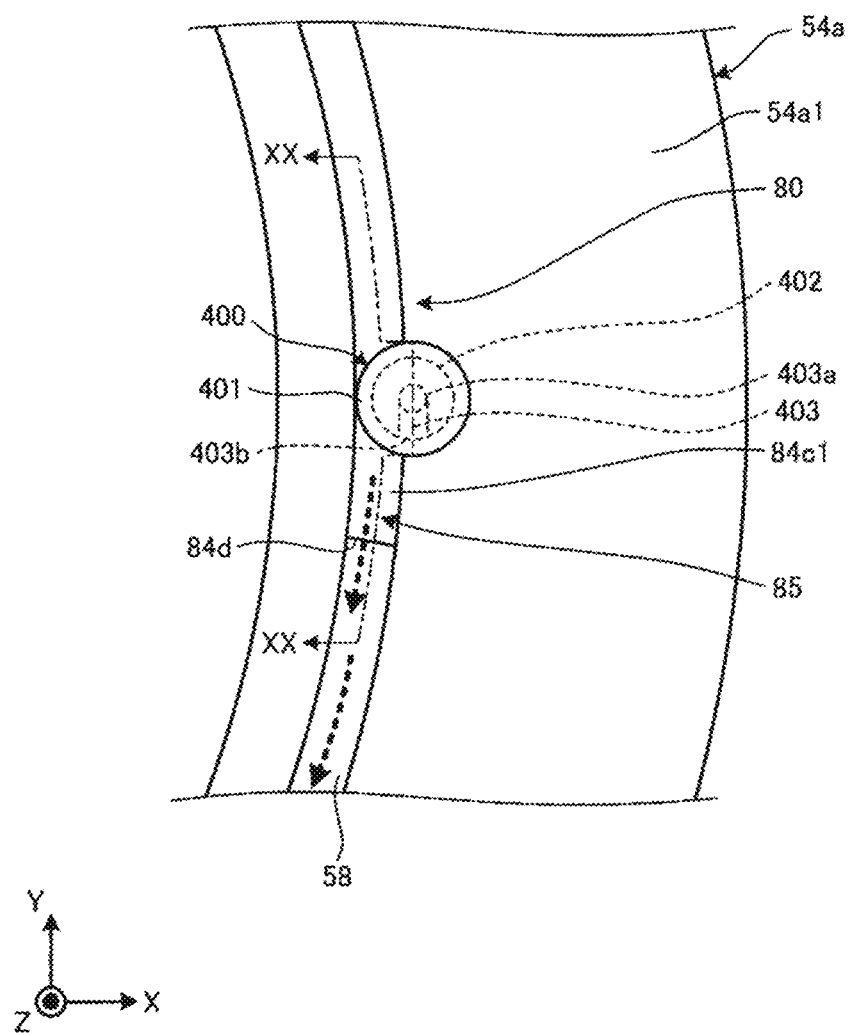
FIG. 19 is an enlarged plan view of FIG. 18.

Hereinafter, the configuration of the intermediate portion 400 will be described in detail with reference to FIGS. 19 and 20. FIG. 19 is a schematic enlarged plan view illustrating the periphery of a closed curve E1 indicated by the alternate long and short dash line in FIG. 18. Further, FIG. 20 is a cross-sectional view taken along the line XX-XX of FIG. 19.

Figure 20:
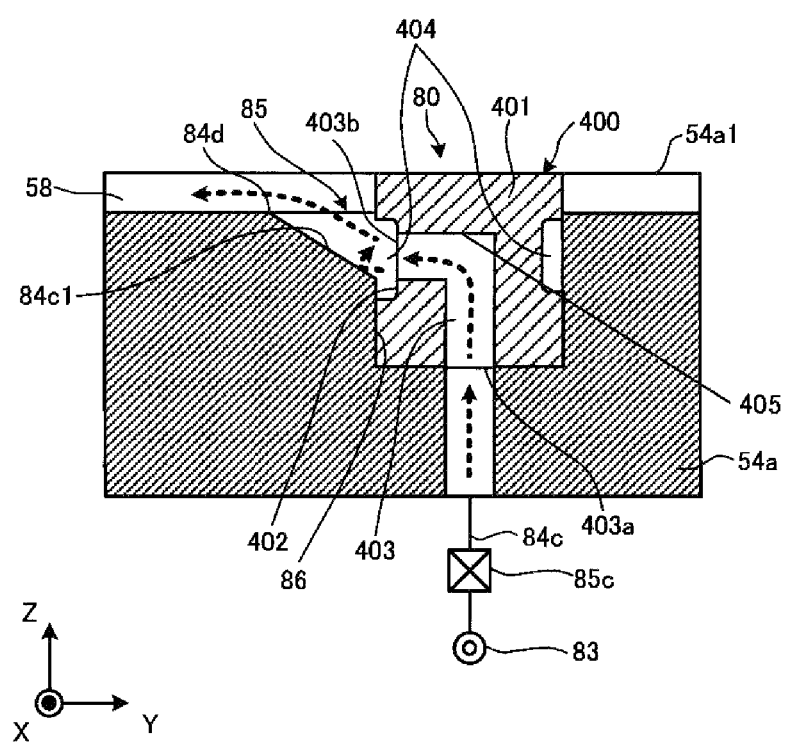
FIG. 20 is a cross-sectional view taken along the line XX-XX of FIG. 19.

As illustrated in FIGS. 19 and 20, the cleaning liquid supply unit 80 includes the intermediate portion 400, and the intermediate portion 400 is constituted by a base 401 having a recess 402 and a flow path 403.

The base 401 is formed in a cylindrical shape (an example of the columnar shape), but is not limited thereto. The base 401 may have other shapes such as, for example, a prismatic shape. The recess 402 is formed along the circumferential direction on the lateral surface of the base 401. In the example illustrated in FIGS. 19 and 20, the recess 402 is formed over the whole circumference on the lateral surface of the base 401, but is not limited thereto. The recess 402 may be formed in a part of the lateral surface of the base 401.

Further, a retention portion 404 is formed between the recess 402 and the first peripheral wall portion 54a. The retention portion 404 is a space defined by the recess 402 and the first peripheral wall portion 54a when the intermediate portion 400 is mounted to the first peripheral wall portion 54a. Since the cleaning liquid supplied from the cleaning liquid supply pipe 84c temporarily remain in the retention portion 404 as described below, the hydropower of the cleaning liquid may be weakened, and the cleaning liquid may be suppressed from being scattered. Further, in the retention portion 404, the flow rate of the cleaning liquid may be increased by the retention of the cleaning liquid, so that the cleaning liquid may be spread over the whole groove portion 58 in a short time.

The flow path 403 is formed inside the base 401, and the cleaning liquid supplied from the cleaning liquid supply pipe 84c flows therethrough. In the flow path 403, an inlet 403a is formed at one end, and an outlet 403b is formed at the other end. Further, a facing surface 405 is formed on the surface facing the inlet 403a.

The inlet 403a is formed in the vicinity of the center of the lower surface of the base 401, and connected to the cleaning liquid supply pipe 84c so that the cleaning liquid flows thereto. The outlet 403b is formed in the recess 402 to allow the cleaning liquid flowing into the inlet 403a to flow out. In other words, the outlet 403b is formed on the lateral surface of the base 401. In this way, the inlet 403a is formed on the bottom surface of the base 401, the outlet 403b is formed on the lateral surface of the base 401, and the facing surface 405 is formed on the upper surface of the flow path 403 that face the inlet 403a. Thus, the flow path 403 has a bent shape inside the base 401, and is formed in, for example, an inverted L shape in cross-section, but the shape and the like are not limited thereto.

The intermediate portion 400 configured as described above is mounted to a mounting hole 86 formed in the first peripheral wall portion 54a, as illustrated in FIG. 20. At this time, the intermediate portion 400 is mounted to the mounting hole 86 such that the axial direction of the cylindrical base 401 follows the Z-axis direction. Further, the intermediate portion 400 is positioned such that the inlet 403a is connected to the cleaning liquid supply pipe 84c and the outlet 403b is directed to the inclined portion of the cleaning liquid supply path 84c1, in a state of being mounted to the mounting hole 86.

Next, the flow of the cleaning liquid will be described. As indicated by the arrow in broken line in FIG. 20, the cleaning liquid flows from the cleaning liquid supply pipe 84c into the inlet 403a, and then ejected from the outlet 403b through the flow path 403. At this time, since the cleaning liquid crashes into the facing 405, which is the upper end of the flow path 403, and then flows to the outlet 403b, the hydropower is appropriately weakened. Further, since the outlet 403b is formed in the recess 402, the cleaning liquid ejected from the outlet 403b crashes into and splashes from the inclined portion of the cleaning liquid supply path 84c1. Thus, the cleaning liquid temporarily remain in the retention portion 404, resulting in increase in flow rate.

Then, the cleaning liquid of which the flow rate is increased in the retention portion 404 flows from the inclined portion of the cleaning liquid supply path 84c1 toward the upper end edge 84d, and then ejected from the ejection port 85 in a direction along the groove portion 58 (in the left direction of the paper in FIG. 20). That is, the intermediate portion 400 tilts the ejection direction of the ejection port 85 with respect to the Z-axis direction, and ejects the cleaning liquid from the ejection port 85 in the direction along the groove portion 58.

Therefore, in the third exemplary embodiment, the cleaning liquid may flow in one direction along the circumferential direction on the upper surface 54a1 of the first peripheral wall portion 54a as illustrated in FIG. 18. Thus, the cleaning liquid may be more widely spread on the upper surface 54a1, which may, in turn, be efficiently cleaned.

Further, the ejection port 85 is formed such that the opening area is larger than an area of the flow path of the cleaning liquid supply pipe 84c. Thus, the cleaning liquid may be supplied to the groove portion 58 in a relatively large amount, so that the cleaning liquid may be spread over the whole groove portion 58 in a short time. Further, it is also possible to suppress the hydropower of the cleaning liquid from excessively increasing. The intermediate portion 400 is formed separately from the first peripheral wall portion 54a, but may be formed integrally therewith.

Fourth Exemplary Embodiment

Subsequently, descriptions will be made on the cleaning liquid supply unit 80 of the processing unit 16 according to a fourth exemplary embodiment. The intermediate portion 400 according to the fourth exemplary embodiment includes a plurality (e.g., two) of outlets 403b.

Figure 21:
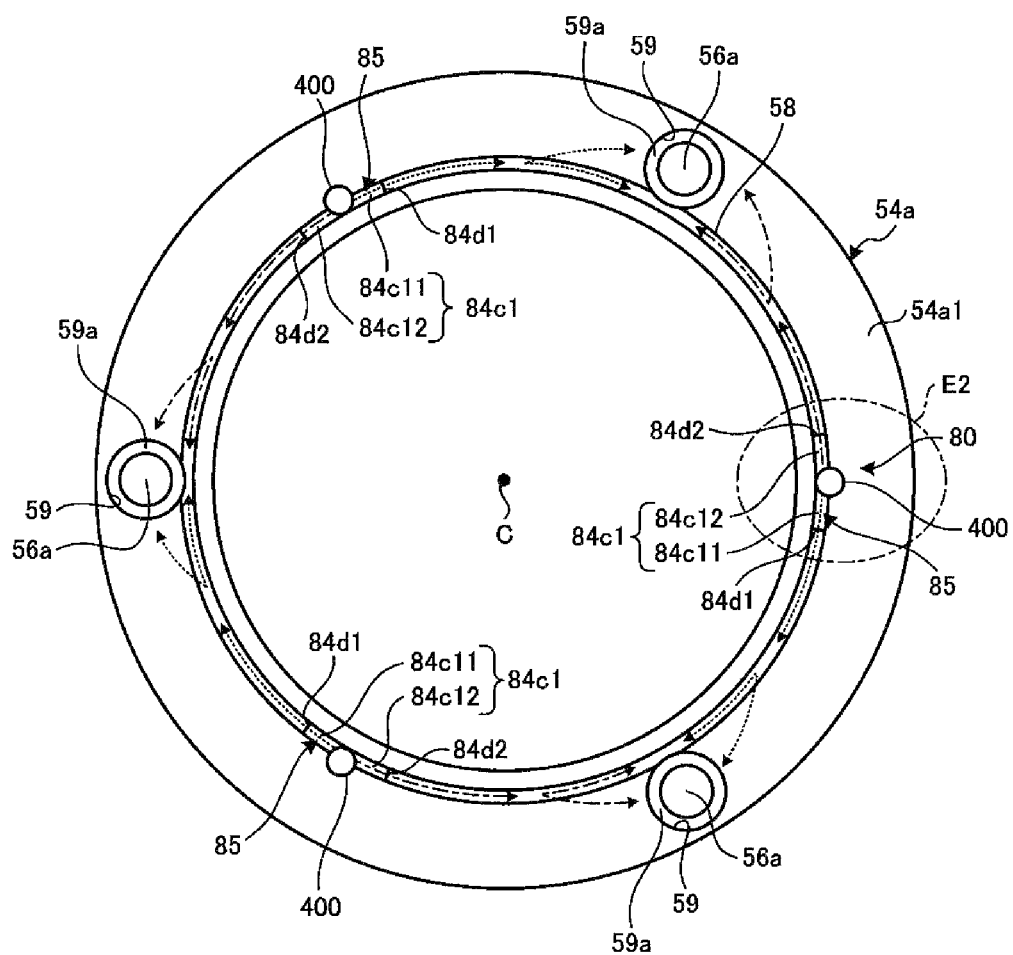
FIG. 21 is a schematic plan view of a first peripheral wall portion according to a fourth exemplary embodiment.
Figure 21:
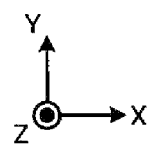

FIG. 21 is a schematic plan view of the first peripheral wall portion 54a according to the fourth exemplary embodiment. As illustrated in FIG. 21, in the fourth exemplary embodiment, the ejection port 85 is an opening formed so that the opening area is larger than that of the ejection port 85 of the third embodiment in a plan view.

Further, the cleaning liquid supply path 84c1 connected to the ejection port 85 includes a first cleaning liquid supply path 84c11 and a second cleaning liquid supply path 84c12, and the intermediate portion 400 is provided between the first cleaning liquid supply path 84c11 and the second cleaning liquid supply path 84c12.

Figure 22:
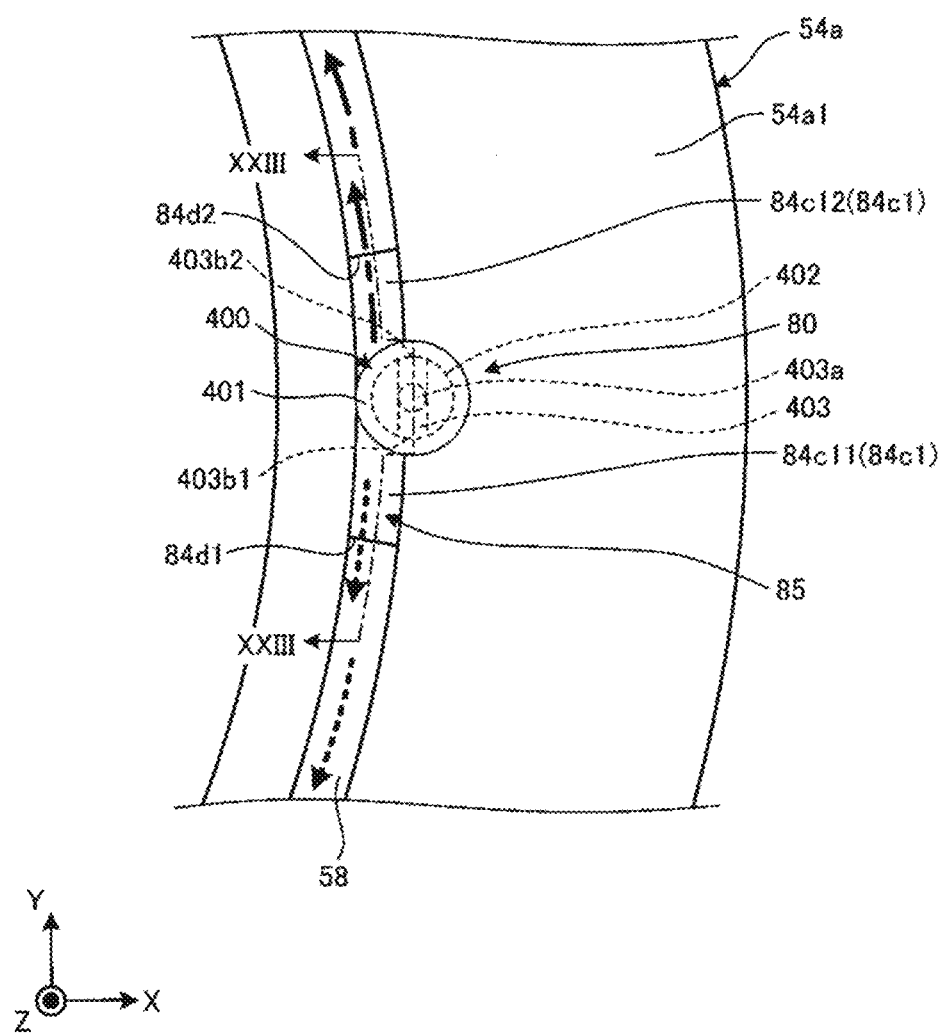
FIG. 22 is an enlarged plan view of FIG. 21.
Figure 23:
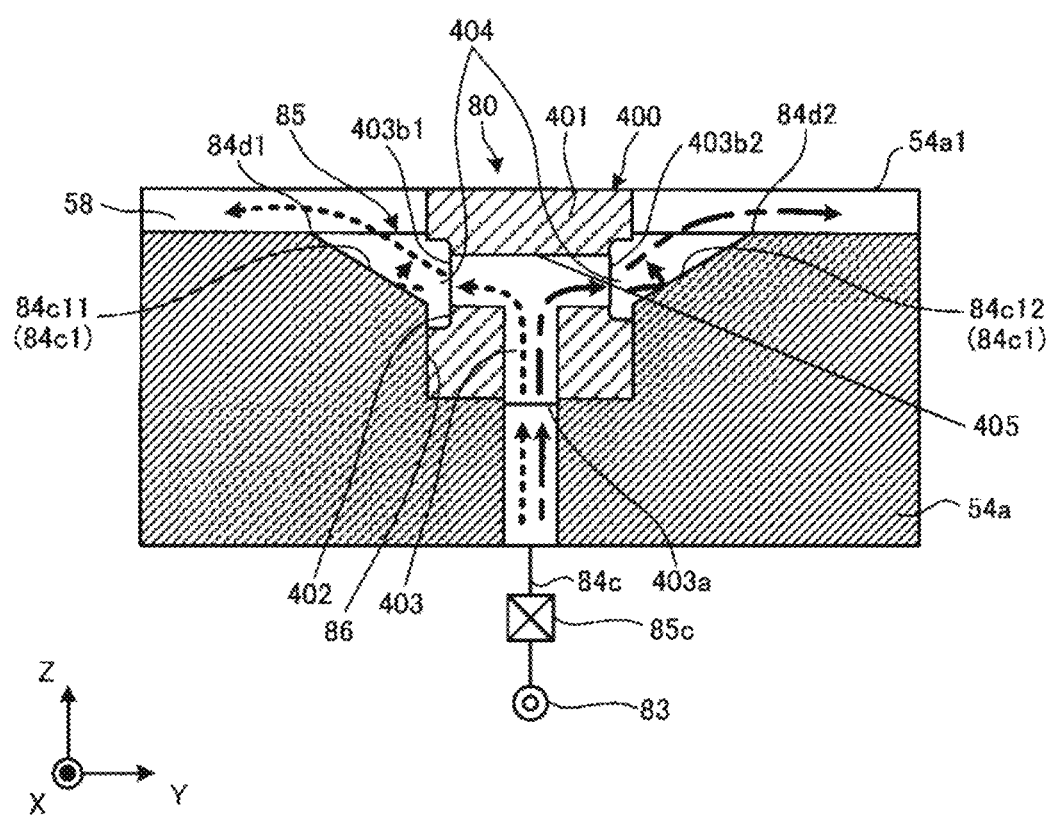
FIG. 23 is a cross-sectional view taken along the line XXIII-XXIII of FIG. 22.

FIG. 22 is a schematic enlarged plan view illustrating the periphery of a closed curve E1 indicated by the alternate long and short dash line in FIG. 21. FIG. 23 is a cross-sectional view taken along the line XXIII-XXIII of FIG. 22.

In the example illustrated in FIG. 23, the first cleaning liquid supply path 84c11 includes a portion inclined toward the Y-axis negative direction side with respect to the Z-axis direction, and the second cleaning liquid supply path 84c12 includes a portion inclined toward the Y-axis positive direction side with respect to the Z-axis direction. That is, the first cleaning liquid supply path 84c11 and the second cleaning liquid supply path 84c12 are formed to be substantially symmetrical. The inclined direction or the substantially symmetrical shape of the he first and second cleaning liquid supply path 84c11, 84c12 are merely illustrative and are not limited thereto. Further, the boundary between the ejection port 85 and the groove portion 58 includes an upper end edge 84d1 of the first cleaning liquid supply path 84c11 and an upper end edge 84d2 of the inclined portion of the second cleaning liquid supply path 84c12, but is not limited thereto.

The intermediate portion 400 of the cleaning liquid supply unit 80 includes a plurality of (e.g., two (2)) outlets 403b1, 403b2 of the cleaning liquid, having different opening directions. Here, one outlet 403b1 is referred to as a "first outlet 403b1" and the other outlet 403b2 is referred to as a "second outlet 403b2" in some cases.

Specifically, in the intermediate portion 400, the flow path 403 is branched on the way, and the first outlet 403b1 is formed on one end of the downstream side of the branched flow path 403, and the second outlet 403b2 is formed on the other end thereof. For example, the opening direction of the first outlet 403b1 is the left direction of the paper in FIG. 23, and the opening direction of the second outlet 403b2 is the right direction of the paper in FIG. 23. That is, the first and second outlets 403b1, 403b2 may be formed to be opposed to each other.

In other words, the first and second outlets 403b1, 403b2 may be opened to be symmetrical or substantially symmetrical in cross-section along the circumferential direction of the first peripheral wall portion 54a. In this case, the flow path 403 is formed in, for example, a T shape in cross-section, inside the base 401. The shape and the number of the flow path 403 or the first and second outlets 403b1, 403b2 are illustrative and not limited thereto.

Further, the intermediate portion 400 is positioned such that the first outlet 403b1 is directed to the inclined portion of the first cleaning liquid supply path 84c11 and the second outlet 403b2 is directed to the inclined portion of the second cleaning liquid supply path 84c12, in a state of being mounted to the mounting hole 86.

Since the intermediate portion 400 and the first and second cleaning liquid supply paths 84c11, 84c12 are configured as described above, the cleaning liquid ejects from the intermediate portion 400 in two directions. That is, as indicated by the arrow of the broken line, the cleaning liquid ejected from the first outlet 403b1 through the flow path 403 flows from the inclined portion of the first cleaning liquid supply path 84c11 toward the upper end edge 84d1, and then ejected from the ejection port 85 in a direction along the groove portion 58 (in the left direction of the paper in FIG. 23).

Meanwhile, as indicated by the arrow of the alternate long and short dash line, the cleaning liquid ejected from the second outlet 403b2 through the flow path 403 flows from the inclined portion of the second cleaning liquid supply path 84c12 toward the upper end edge 84d2, and then ejected from the ejection port 85 in a direction along the groove portion 58 (in the right direction of the paper in FIG. 23).

Therefore, in the fourth exemplary embodiment, as illustrated in FIG. 21, the ejection port 85 may eject the cleaning liquid toward the insertion holes 59 adjacent to both sides in a plan view. Thus, the upper surface 54a1 between both insertion holes 59 adjacent to the ejection port 85 may be efficiently cleaned at an early stage.

Although not illustrated, in the intermediate portion 400, for example, an outlet of the cleaning liquid may be formed on the upper surface of the base 401, and the upper surface of the base 401 may be cleaned by ejecting the cleaning liquid from the outlet.

<6. Another Example of Cleaning Processing>

Figure 24:
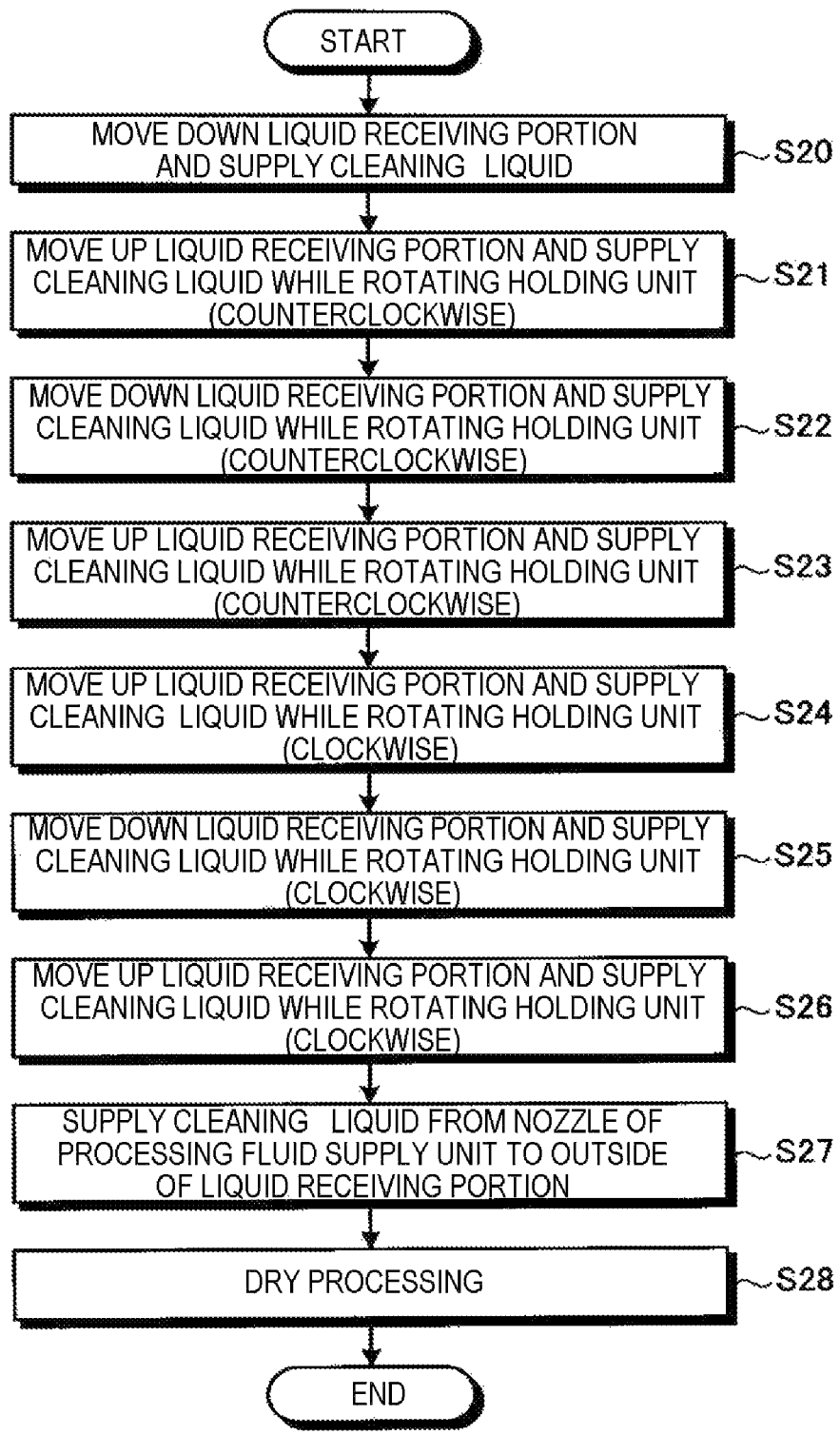
FIG. 24 is a flowchart illustrating another exemplary processing procedure of the cleaning processing.

Next, another example of the cleaning processing will be described. The cleaning processing has been described above with reference to FIG. 8, but is not limited thereto. FIG. 24 is a flowchart illustrating another exemplary processing procedure of the cleaning processing. The processing in FIG. 24 is performed by, for example, the processing unit 16 according to the fourth exemplary embodiment, but is not limited thereto.

As illustrated in FIG. 24, the controller 18 of the control device 4 moves down the first liquid receiving portion 55a to the retreat position by the first lift driving unit 56b, and supplies the cleaning liquid (step S20). Therefore, the cleaning may be performed on, for example, the periphery of the ejection port 85 or the intermediate portion 400.

Subsequently, the controller 18 moves up the first liquid receiving portion 55*a* to the processing position, and supplies the processing liquid while rotating the holding unit 31 by the driving unit 33 in the counterclockwise direction (step S21). Therefore, since a swirling flow is generated by rotating the holding unit 31, the cleaning liquid may be widely spread over a portion relatively far from the ejection port 85, thereby performing the cleaning.

Next, the controller 18 moves down the first liquid receiving portion 55*a* to the retreat position, and supplies the processing liquid while rotating the holding unit 31 in the counterclockwise direction (step S22). Therefore, the lower surface 55*a*1 of the first liquid receiving portion 55*a* or the upper surface 54*a*1 of the first peripheral wall portion 54*a* may be cleaned. The controller 18 may repeat the processings of steps S20 to S22 a predetermined number of times.

Next, the controller 18 moves up the first liquid receiving portion 55*a* to the processing position, and supplies the processing liquid while rotating the holding unit 31 in the counterclockwise direction (step S23).

Next, in the state where the first liquid receiving portion 55*a* is moved up to the processing position, the controller 18 supplies the processing liquid while rotating the holding unit 31 in the clockwise direction (step S24). Therefore, in the exemplary embodiment, the cleaning liquid is supplied in a state where the holding unit 31 is rotated in the counterclockwise direction (an example of the predetermined direction), and then, the cleaning liquid is supplied in a state where the holding unit 31 is rotated in the clockwise direction (an example of the direction opposite to the predetermined direction).

Thus, for example, as illustrated in FIG. 21, when the holding unit 31 is rotated in the counterclockwise direction, the cleaning liquid is supplied in a large amount in the direction of the arrow indicated by the alternate long and short dash line. Thus, it is possible to intensively clean the portion to which the processing liquid is supplied in a large amount. Meanwhile, when the holding unit 31 is rotated in the clockwise direction, the cleaning liquid is supplied in a large amount in the direction of the arrow indicated by the broken line. Thus, it is possible to intensively clean the portion to which the processing liquid is supplied in a large amount. That is, since the rotational direction of the holding unit 31 is switched during the cleaning processing, the upper surface 54*a*1 of the first peripheral wall portion 54*a* may be more efficiently cleaned.

Continuing the description of FIG. 24, the controller 18 then moves down the first liquid receiving portion 55*a* to the retreat position, and supplies the processing liquid while rotating the holding unit 31 in the clockwise direction (step S25). The controller 18 may repeat the processings of steps S24 and S25 a predetermined number of times.

Next, the controller 18 moves up the first liquid receiving portion 55*a* to the processing position, and supplies the processing liquid while rotating the holding unit 31 in the clockwise direction (step S26).

Then, the cleaning of the outer peripheral side of the first liquid receiving portion 55*a* is performed. Specifically, the controller 18 moves down the first liquid receiving portion 55*a* to the retreat position, and moves up the second liquid receiving portion 55*b* to the processing position (see, e.g., FIG. 3). Thus, the first liquid receiving portion 55*a* and the second liquid portion 55*b* are separated from each other.

Then, the controller 18 moves the nozzle 41 of the processing fluid supply unit 40 to the periphery of the first liquid receiving portion 55*a*, and ejects DIW as the cleaning liquid. Therefore, the cleaning liquid is supplied from the gap between the first liquid receiving portion 55*a* and the second liquid receiving portion 55*b* to the outer peripheral side of the first liquid receiving portion 55*a*, and thus, the cleaning of the outer peripheral side of the first receiving portion 55*a* is performed (step S27).

Since the cleaning of the inner peripheral side of the first liquid receiving portion 55*a* is performed, for example, during the second chemical liquid processing in step S4 illustrated in FIG. 7, the cleaning is not performed in this cleaning processing. However, the cleaning of the inner peripheral side of the first liquid receiving portion 55*a* may be performed before or after the cleaning of the outer peripheral side thereof. At the time of the cleaning of the inner peripheral side of the first liquid receiving portion 55*a*, for example, a second chemical liquid may be supplied to the inner peripheral side of the first liquid receiving portion 55*a* for several seconds to wash out, for example, crystals. At this time, since the second chemical liquid, which has washed out the first liquid receiving portion 55*a*, may include crystals, the second chemical liquid may not enter the recovery line but flow to the drain line. Then, the second chemical liquid may begin to be recovered by switching from the drain line to the recovery line at a time point when the crystals are no longer included therein after the lapse of a predetermined time.

When cleaning the bottom surface 55*a*1 of the first liquid receiving portion 55*a*, the upper surface 54*a*1 of the first peripheral wall portion 54*a*, or the outer peripheral side of the first liquid receiving portion 55*a*, the cleaning liquid including, for example, crystals of BHF flows into the second drain groove 501*b* (see, e.g., FIG. 3). Since the second drain groove 501*b* is a drain groove for an alkaline processing liquid, it is undesirable that the cleaning liquid including the crystals of BHF serving as an acidic processing liquid flows from the second drain groove 501*b* into the drain line through the drain pipe 91*b*.

Thus, in the exemplary embodiment, when the cleaning liquid including the crystals of BHF flows into the second drain groove 501*b*, although not shown, the valve 62*b* is switched such that the inflowing cleaning liquid flows to the second drain pipe 91*a*2 serving as a drain line of the cleaning liquid. Therefore, the cleaning liquid including the crystals of BHF may be suppressed from flowing to the downstream side of the valve 62*b* and flowing into the alkaline processing liquid drain line.

Continuing the description of FIG. 24, the controller 18 then performs a dry processing (step S28). Specifically, the controller 18 stops the supply of the cleaning liquid, and rotates the holding unit 31 in the clockwise direction to generate a swirling flow, thereby drying the first peripheral wall portion 54*a* or the first liquid receiving portion 55*a*. When the dry processing is completed, a series of cleaning processings is terminated.

In the exemplary embodiment, the processing liquid is supplied from the ejection port 85 of the cleaning liquid supply pipe 84*c* to the upper surface 54*a*1 of the first peripheral wall portion 54*a*, but is not limited thereto. That is, for example, a supply nozzle of the cleaning liquid may be disposed at a position facing the upper surface 54*a*1, so that the cleaning liquid is supplied from the supply nozzle to the upper surface 54*a*1.

Further, in the above descriptions, the cleaning liquid supply unit 80 cleans the upper surface 54*a*1 of the first peripheral wall portion 54*a*, but is not limited thereto. That is, instead of, or in addition to the cleaning of the upper surface 54a1, the cleaning liquid supply unit 80 may clean the upper surface 54b1 of the second peripheral wall portion 54b.

The exemplary embodiment of weakening the hydropower of the processing liquid from the cleaning liquid supply pipe is not limited to the intermediate portion 400 in the third exemplary embodiment or the fourth exemplary embodiment. In order to weaken the flow rate of the cleaning liquid from the cleaning liquid supply pipe, a retention portion may be provided between the ejection port of the cleaning liquid supply pipe 84c and the cleaning liquid ejection port 85 to temporarily retain the processing liquid. Thus, the hydropower of the cleaning liquid from the cleaning liquid supply pipe may be weakened. Further, in order to weaken the flow rate of the cleaning liquid from the cleaning liquid supply pipe, a surface facing the ejection port of the cleaning liquid supply pipe 84c may be provided to change the flow of the cleaning liquid, and a retention portion may be provided to temporarily retain the processing liquid of which the flow is changed. Thus, the hydropower of the cleaning liquid from the cleaning liquid supply pipe may be weakened.

Further, in the processing unit 16 described above, the acidic processing liquid is recovered through the first drain pipe 91a1 and is reused, but is not limited thereto. The acidic processing liquid may not be reused. Further, in the above descriptions, the first lift driving unit 56b and the second lift driving unit 57b are separate members, but is not limited thereto. For example, the first and second lift driving units 56b, 57b may be a common member.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a substrate holder configured to hold a substrate;
   a processing liquid supply source configured to supply a processing liquid to the substrate;
   a cup including a bottom portion, a tubular peripheral wall portion erected on the bottom portion, a liquid receiving plate provided above and separate from the peripheral wall portion and configured to receive the processing liquid scattered from the substrate, a support rod configured to support the liquid receiving plate and move the liquid receiving plate up and down with respect to the peripheral wall portion, an insertion hole formed inside the peripheral wall portion to allow the support rod to be inserted therethrough, and a groove portion formed in a circumferential direction on an upper surface of the peripheral wall portion, the upper surface of the peripheral wall portion facing the liquid receiving plate, the cup being configured to surround the substrate holder; and
   a cleaning liquid supply source configured to supply a cleaning liquid to the upper surface of the peripheral wall portion.

2. The substrate processing apparatus of claim 1, wherein the cup further includes:
   an opening on the upper surface of the peripheral wall portion,
   wherein the opening is formed to overlap with at least a part of the groove portion in a plan view.

3. The substrate processing apparatus of claim 1, wherein the cleaning liquid supply source includes a cleaning liquid ejection port formed in the groove portion.

4. The substrate processing apparatus of claim 3, wherein the cleaning liquid supply source includes a cleaning liquid supply path connected to the cleaning liquid ejection port, and
   the cleaning liquid supply path is inclined in the circumferential direction of the peripheral wall portion.

5. The substrate processing apparatus of claim 3, wherein the cleaning liquid supply source includes an intermediate portion and a cleaning liquid supply pipe connected to a cleaning liquid supply tank, the intermediate portion being positioned between the cleaning liquid supply pipe and the cleaning liquid ejection port.

6. The substrate processing apparatus of claim 5, wherein the cleaning liquid ejection port has an opening area larger than an area of a flow path of the cleaning liquid supply pipe.

7. The substrate processing apparatus of claim 5, wherein the intermediate portion includes a base formed in a columnar shape, a recess formed in the circumferential direction on a lateral surface of the base, an inlet formed in the base and connected to the cleaning liquid supply pipe, an outlet formed in the recess to allow the cleaning liquid flowing into the inlet to flow out, and a facing formed on a surface of the intermediate portion facing the inlet, and
   wherein a pressure of the cleaning liquid from the cleaning liquid supply pipe is configured to be weakened as the cleaning liquid contacts the facing.

8. The substrate processing apparatus of claim 1, wherein the peripheral wall portion includes an inclined portion formed on the upper surface and having a downward slope toward the groove portion.

9. The substrate processing apparatus of claim 1, wherein the peripheral wall portion includes an inclined portion formed on the upper surface and having a downward slope toward a lateral surface of the peripheral wall portion.

10. The substrate processing apparatus of claim 7, further comprising:
    a controller configured to control the cleaning liquid supply source and the liquid receiving plate,
    wherein the controller is programmed to cause the cleaning liquid supply source to supply the cleaning liquid from the cleaning liquid supply source in a state where the liquid receiving plate is moved to a retreat position below a processing position by support rod.

11. The substrate processing apparatus of claim 1, wherein the controller is programmed to cause the cleaning liquid supply source to change a flow rate of the cleaning liquid when cleaning the upper surface of the peripheral wall portion and when cleaning a lower surface of the liquid receiving plate.

12. The substrate processing apparatus of claim 1, further comprising:
    a controller programmed to control the cleaning liquid supply source and the substrate holder,
    wherein the controller is programmed to cause the cleaning liquid supply source to supply the cleaning liquid in a state where the substrate holder is rotated by a driver.

13. The substrate processing apparatus of claim 12, wherein the cleaning liquid supply source includes a plurality of outlets for the cleaning liquid which are different in opening direction, and
    the controller is programmed to cause the cleaning liquid supply source to supply the cleaning liquid from the plurality of outlets of the cleaning liquid supply source in a state where the substrate holder is rotated in a predetermined direction by the driver, and then supply the cleaning liquid from the plurality of outlets of the cleaning liquid supply source in a state where the substrate holder is rotated in a direction opposite to the predetermined direction by the driver.

14. The substrate processing apparatus of claim 1, wherein the cleaning liquid supply source includes a cleaning liquid ejection port formed in the groove portion and a cleaning liquid supply path connected to the cleaning liquid ejection port,
the cleaning liquid supply path is inclined in the circumferential direction of the peripheral wall portion,
the cleaning liquid supply source further includes a cleaning liquid supply pipe connected to a cleaning liquid supply tank,
the cleaning liquid ejection port has an opening area larger than a flow path of the cleaning liquid supply pipe, and
a cleaning liquid retaining portion is provided between the cleaning liquid supply pipe and the cleaning liquid ejection port.

* * * * *